United States Patent
Sato et al.

[11] Patent Number: 6,100,132
[45] Date of Patent: Aug. 8, 2000

[54] METHOD OF DEFORMING A TRENCH BY A THERMAL TREATMENT

[75] Inventors: Tsutomu Sato; Ichiro Mizushima; Yoshitaka Tsunashima, all of Yokohama, Japan; Junichiro Iba, Mohegan Lake, N.Y.

[73] Assignee: Kabushiki Kaisha Toshiba, Kawasaki, Japan

[21] Appl. No.: 09/106,082

[22] Filed: Jun. 29, 1998

[30] Foreign Application Priority Data

Jun. 30, 1997 [JP] Japan .................................. 9-174991
May 29, 1998 [JP] Japan .................................. 10-150210
May 29, 1998 [JP] Japan .................................. 10-150348

[51] Int. Cl.$^7$ .............................................. H01L 21/8242
[52] U.S. Cl. .......................... 438/243; 438/244; 438/246; 438/247; 438/386; 438/387; 438/389; 438/390; 438/909
[58] Field of Search ..................... 438/243, 244, 438/246, 247, 386, 387, 389, 390, 909

[56] References Cited

U.S. PATENT DOCUMENTS 5,112,771  5/1992  Ishii et al. ................................ 438/684
5,256,566  10/1993  Bailey ...................................... 438/389
5,629,226  5/1997  Ohtsuki .................................... 438/389
6,025,245  2/2000  Wei .......................................... 438/386

*Primary Examiner*—Richard Booth
*Assistant Examiner*—Jennifer M. Kennedy
*Attorney, Agent, or Firm*—Finnegan, Henderson, Farabow, Garrett & Dunner, L.L.P.

[57] ABSTRACT

A semiconductor device includes a semiconductor substrate having a trench on a surface thereof and an embedding member embedding the interior of the trench therewith. While the section of the trench when cut by a first plane perpendicular to the direction of the depth of the trench is defined as a first section and the section of the trench when cut by a second plane perpendicular to the direction of the depth of the trench and closer to the bottom of the trench than the first plane is defined as a second section, the area of the first section is smaller than that of the second section and a minimum radius of curvature of the first section is smaller than a minimum radius of curvature of the second section. As a result, it is possible to lessen the concentration of the electric field into the bottom of the trench.

10 Claims, 22 Drawing Sheets

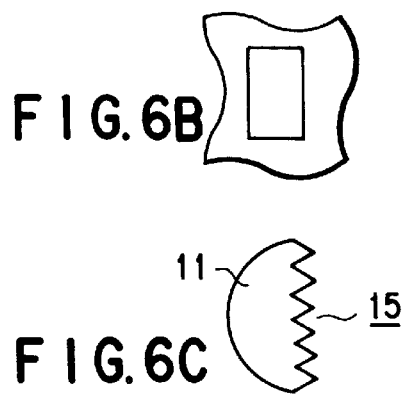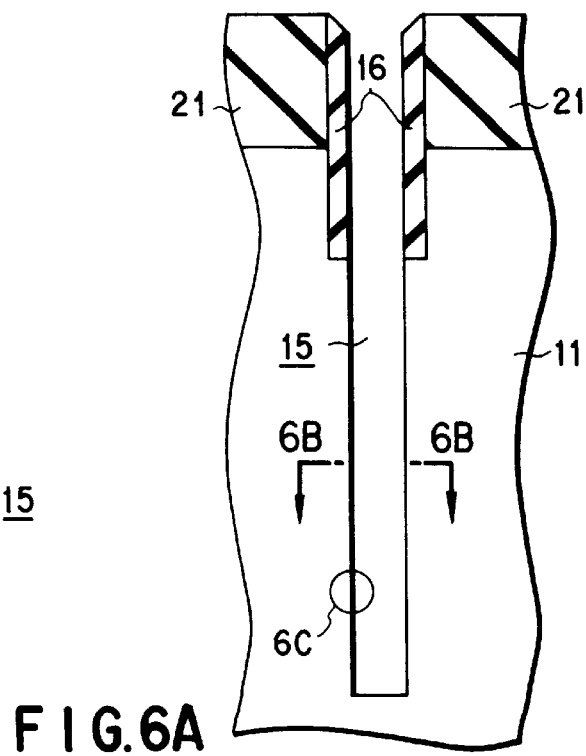
FIG. 6A  FIG. 6B  FIG. 6C
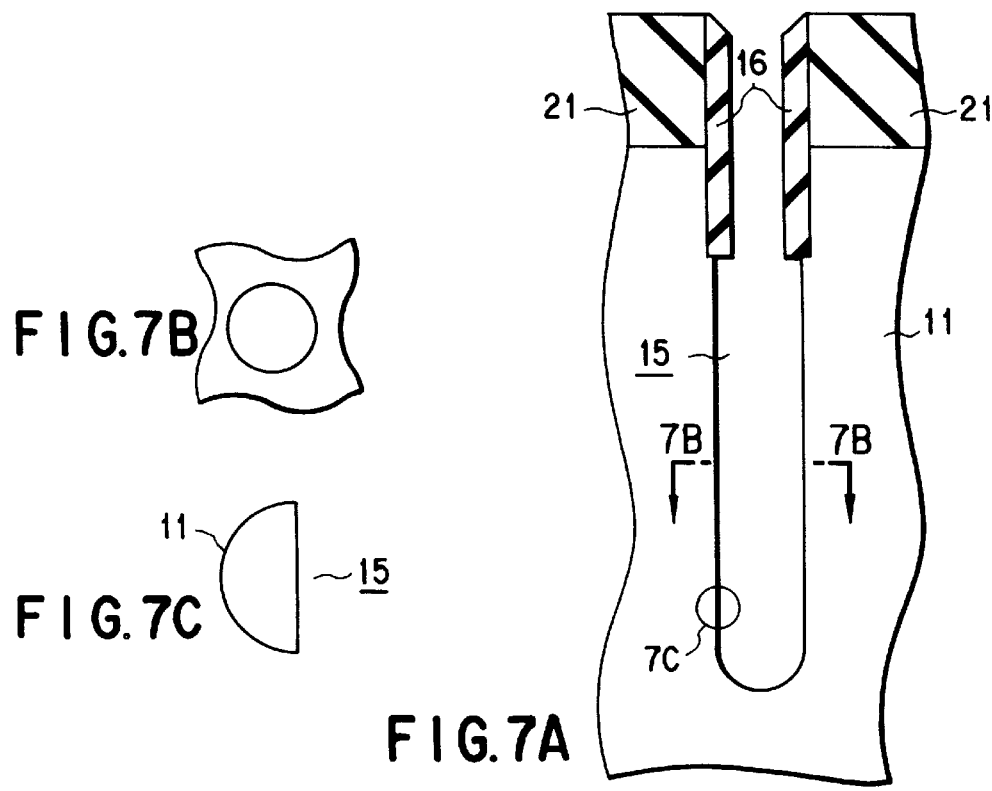
FIG. 7A  FIG. 7B  FIG. 7C

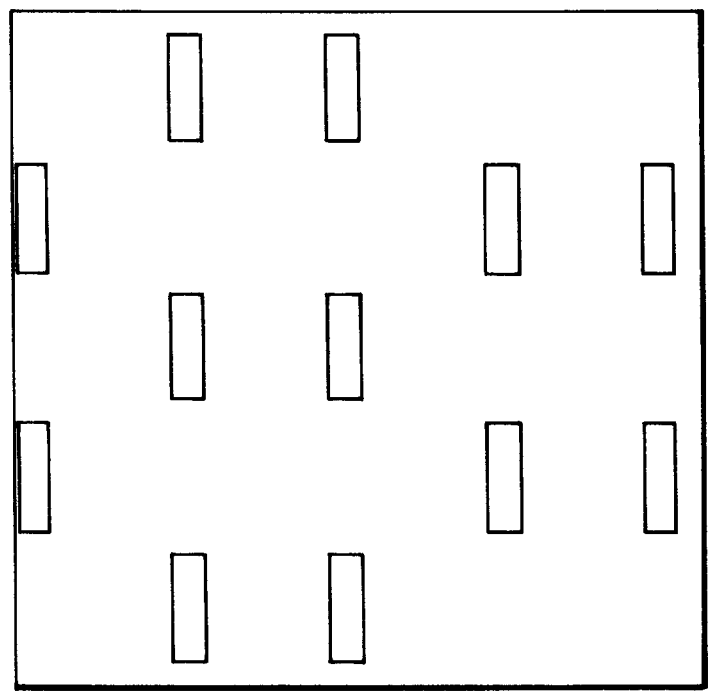
F I G. 12
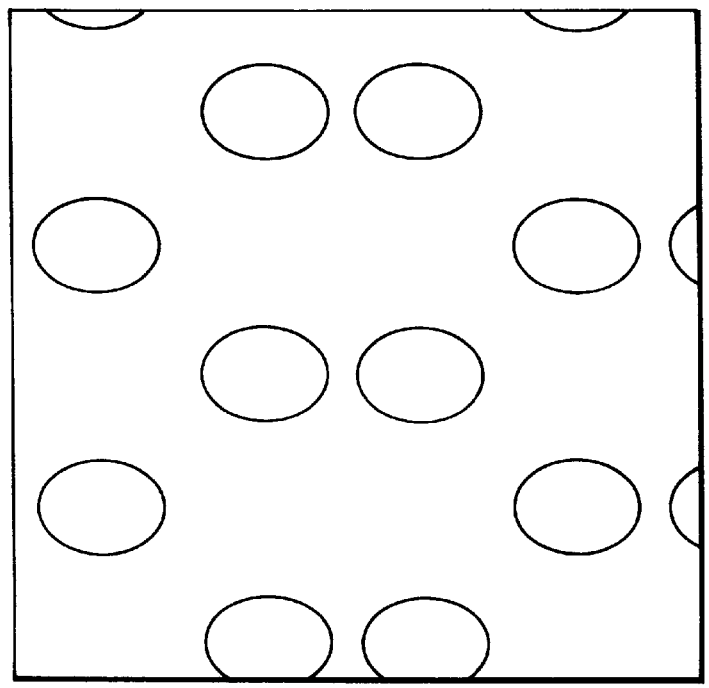
F I G. 13

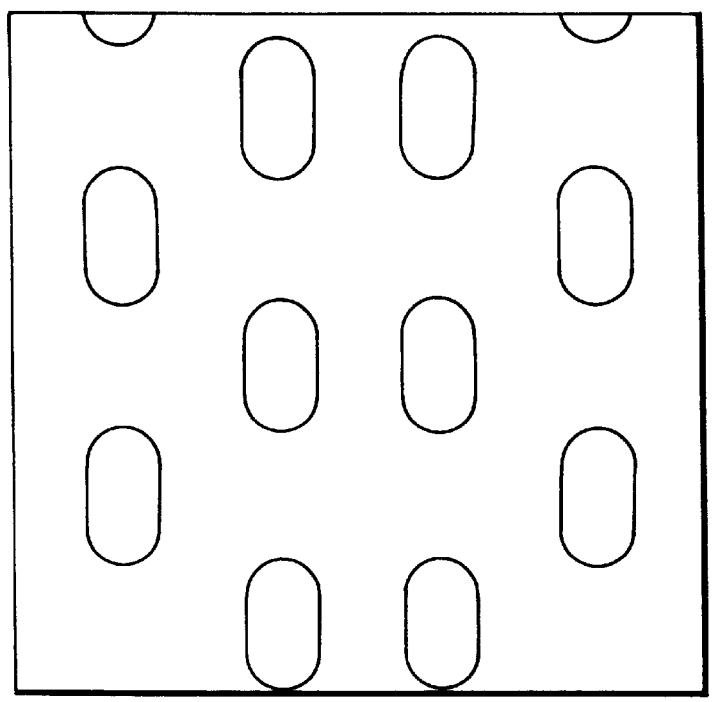
F I G. 14
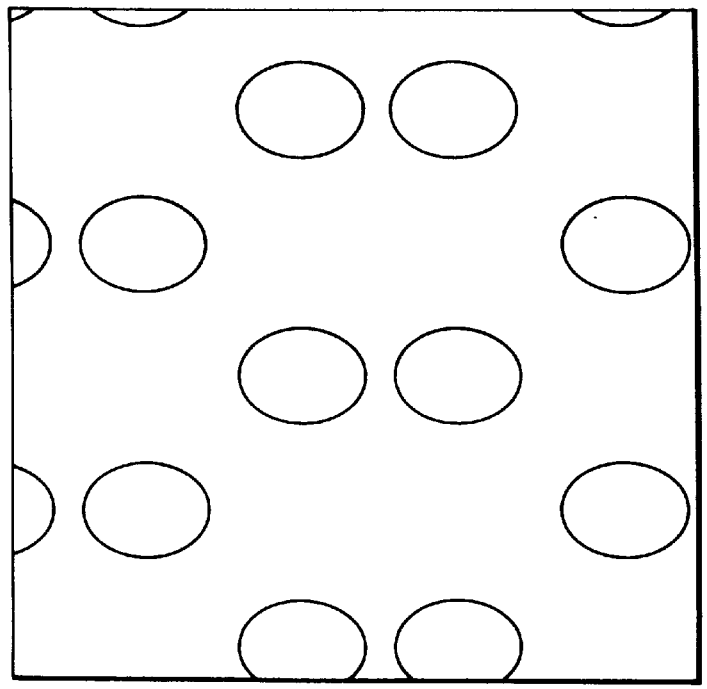
F I G. 15

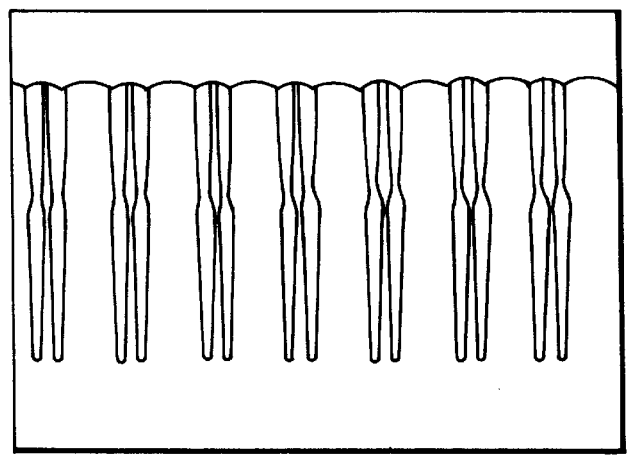
F I G. 16A
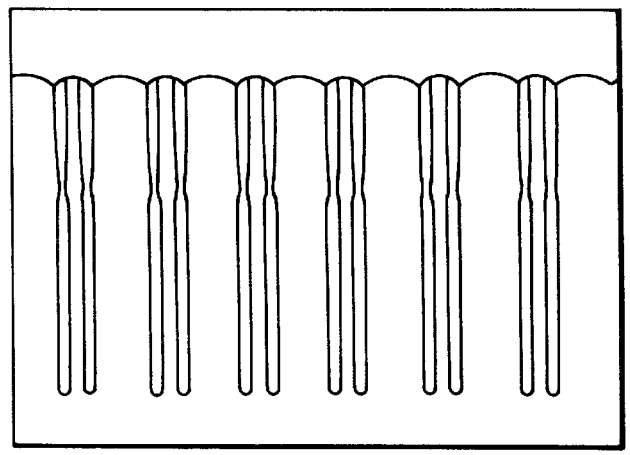
F I G. 16B
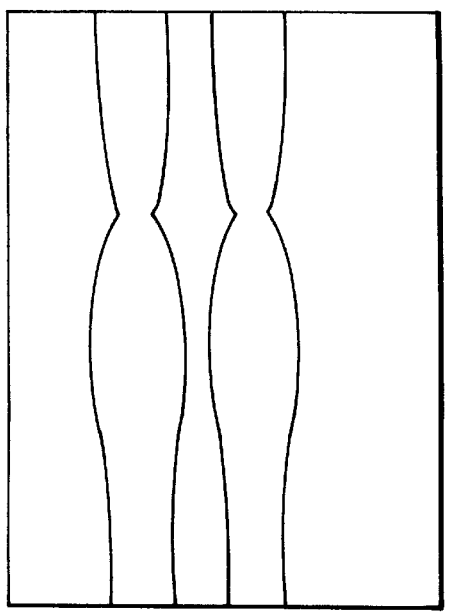
F I G. 17A
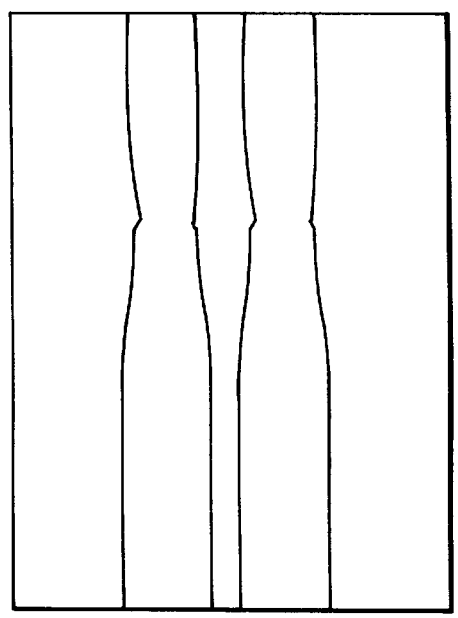
F I G. 17B

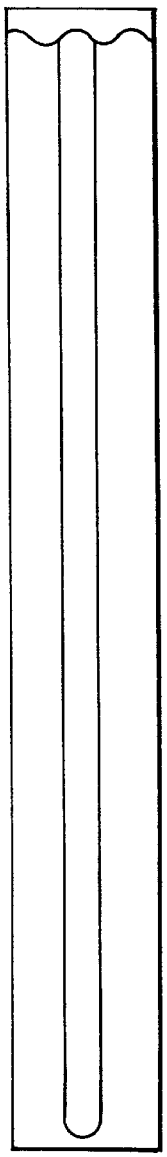
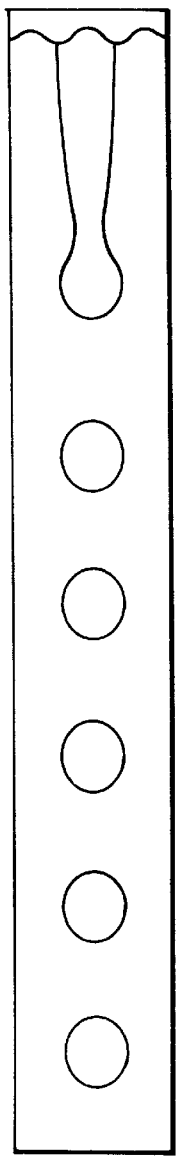
F I G. 24A   F I G. 24B
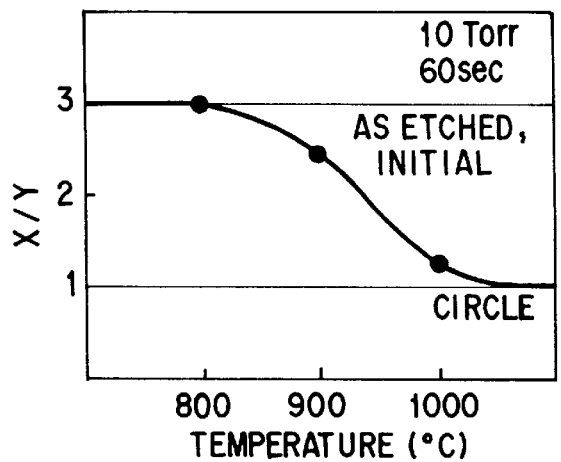
F I G. 25
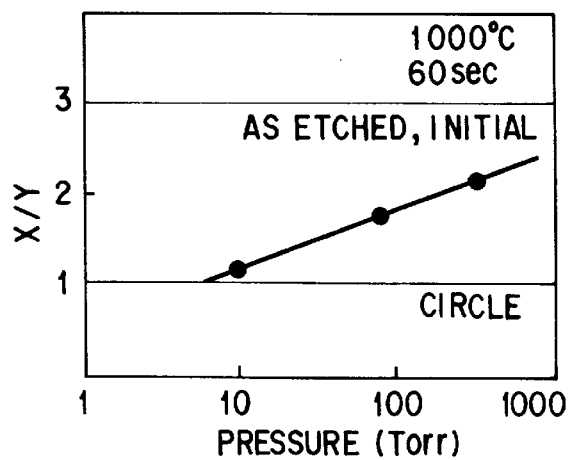
F I G. 26

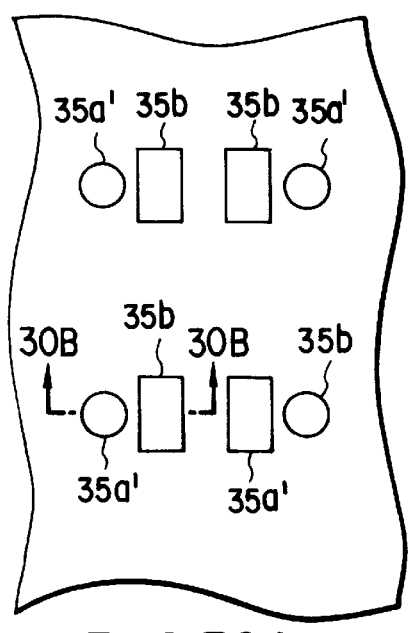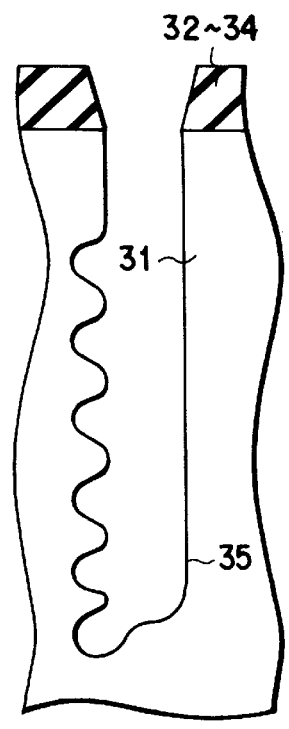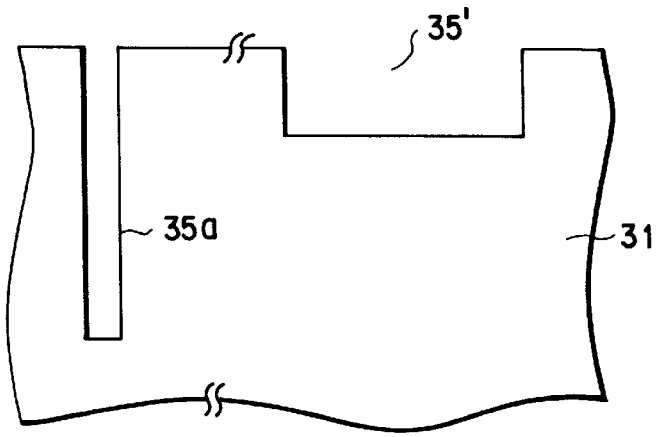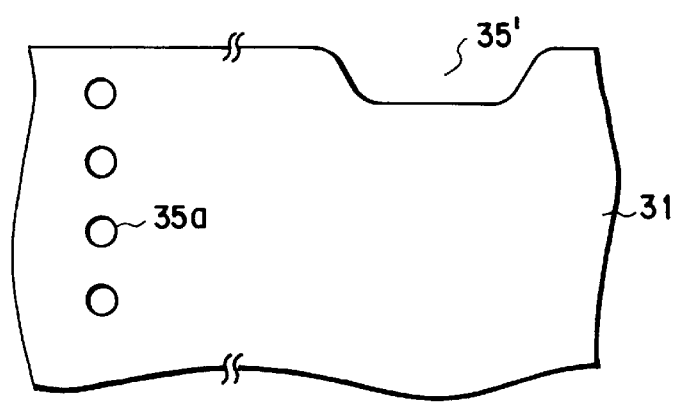
F I G. 30A
F I G. 30B
F I G. 30C
F I G. 31A
F I G. 31B

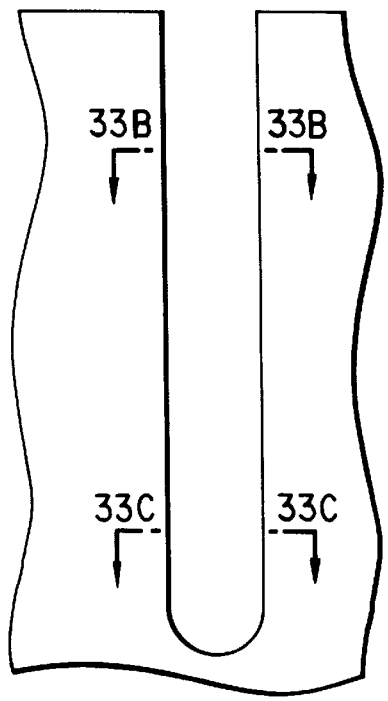
FIG.33A
FIG.33B
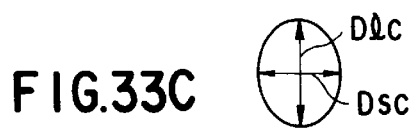
FIG.33C
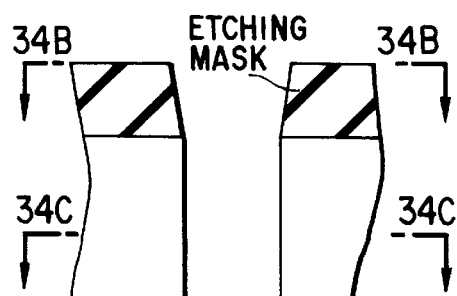
FIG.34A
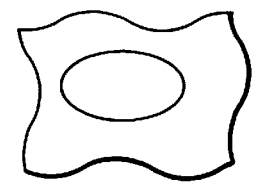
FIG.34B
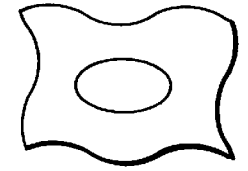
FIG.34C
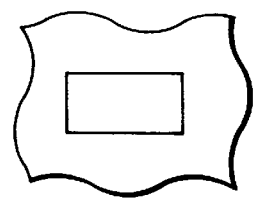
FIG.34D
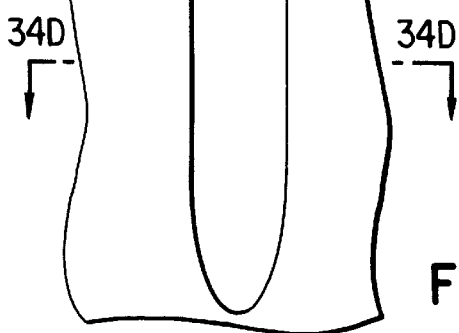

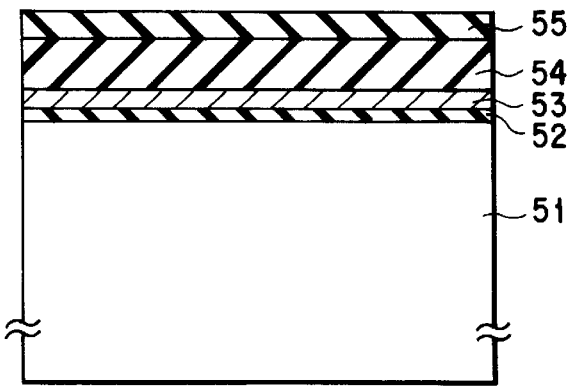
F I G. 35A
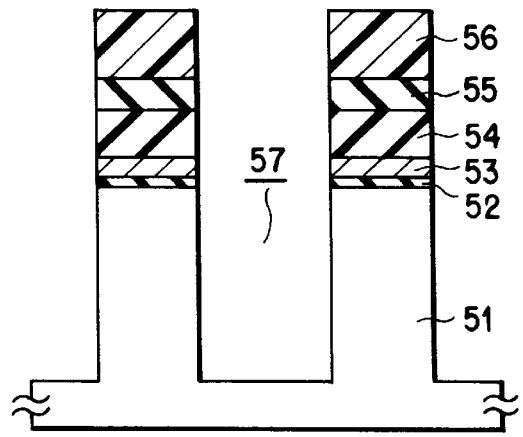
F I G. 35B
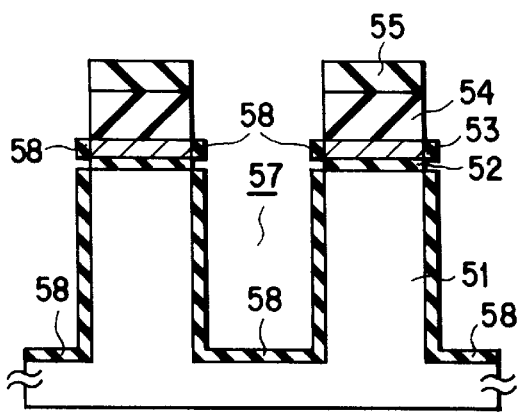
F I G. 35C
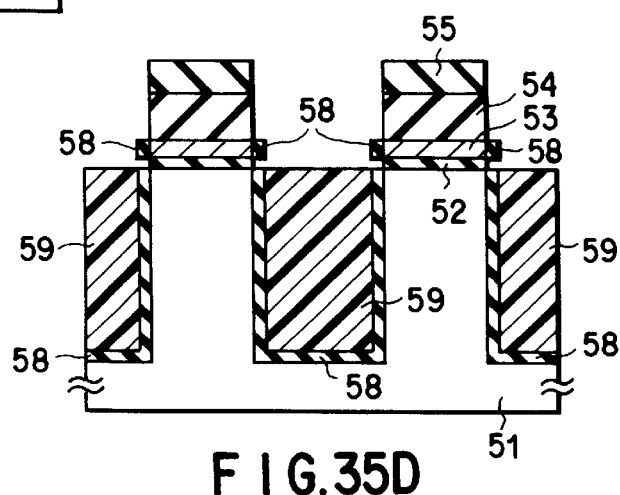
F I G. 35D

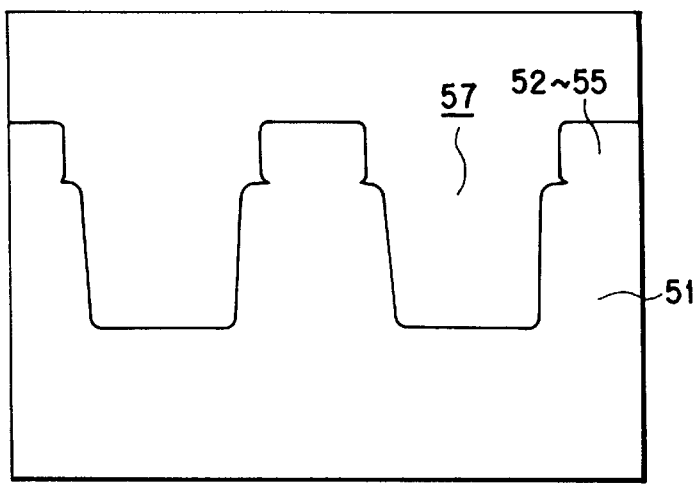
FIG. 36A
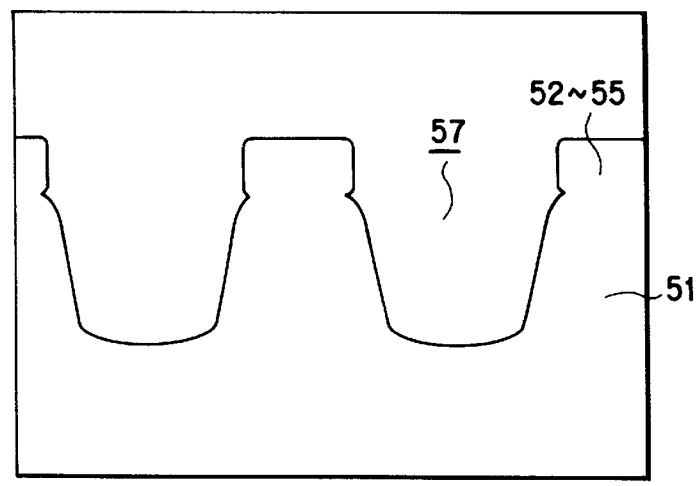
FIG. 36B
FIG. 37
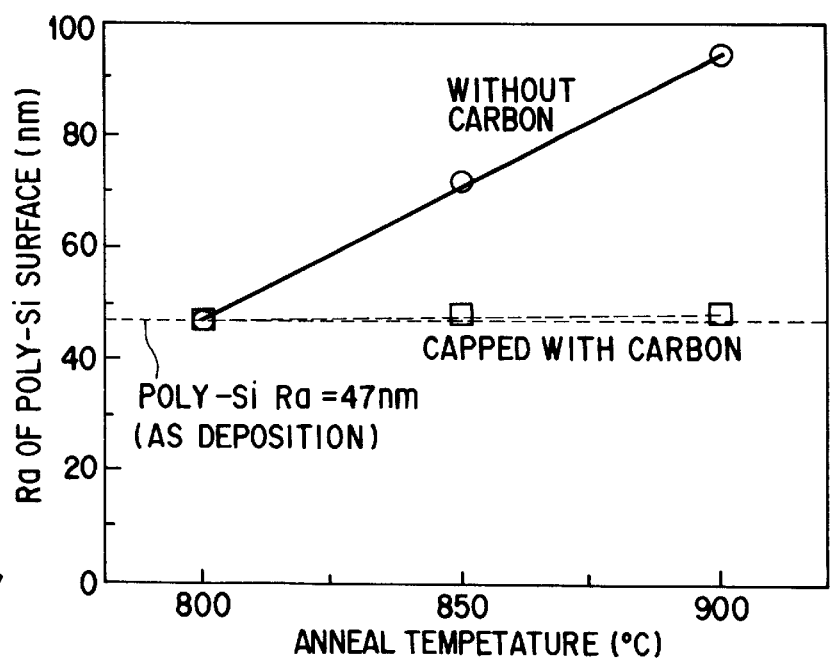

METHOD OF DEFORMING A TRENCH BY A THERMAL TREATMENT

BACKGROUND OF THE INVENTION

The present invention relates to a semiconductor device having a semiconductor substrate having a trench such as a trench capacitor formed on its surface and a manufacturing method thereof.

In recent years, Large Scale Integrated Circuits (LSIs) are widely used in the important parts of computers and communications equipment. Due to this, the performance of the overall system is closely related to the performance of an LSI itself. The improvement in the performance of the single LSI can be realized by improving integration, that is, making elements smaller.

Various problems, however, arise as elements are smaller. In case of a capacitor of a DRAM memory cell, for example, if the area of the capacitor is smaller, its capacity tends to decrease. As a result, software-related errors occur such as the content of memory is erroneously read or the storage content is destroyed by the a line.

As one of the capacitors effective for solving these problems, there is known a trench capacitor. The trench capacitor is intended to ensure necessary capacity by making use of the sides of a trench for the capacitor area.

The trench capacitor has been conventionally formed as follows.

Using photolithography and Reactive Ion Etching (to be referred to as RIE hereinafter), a trench is formed on a silicon substrate. After an arsenic doped glass film is deposited thereon, the arsenic within the arsenic doped glass film is diffused into the surface of the trench by solid phase diffusion and an impurity diffused layer of high impurity concentration which serves as a capacitor electrode (or plate electrode) is formed on the surface of the trench.

Lastly, after forming a capacitor insulating film on the surface of the trench, an arsenic doped amorphous silicon film which serves as a storage node is deposited, whereby the trench capacitor is completed.

The conventional formation method as stated above, however, has the following problems.

If using the RIE, a tapered trench is formed and the embedding shape of the storage node (which is the arsenic doped amorphous silicon film) tends to deteriorate. The deterioration in the embedding shape becomes more obvious if the diameter of the, trench is smaller. This makes it difficult to provide smaller elements.

In addition, as a result of the RIE during the trench formation, the surface of the trench becomes uneven and the electric field concentrates on the uneven portions, thereby disadvantageously decreasing the withstand voltage of the insulating film of the capacitor.

To solve the latter problem, it is proposed the surface of the trench is smoothed by means of Chemical Dry Etching (to be referred to as CDE hereinafter). If a collar oxide film is formed on the upper wall of the trench, the collar oxide film needs to be formed thick by a degree corresponding to that etched by the CDE due to the fact that large etching selectivity between the collar oxide film and the silicon substrate is not expected.

It is however difficult to form a thicker collar oxide film on the upper wall of the trench whose diameter has become narrower as the sizes of the elements including the trench have become smaller. For that reason, the above-stated CDE is not suitable for and inapplicable to the smaller-sized elements.

Furthermore, if an exposure mask of a rectangular pattern is used as an exposure make for trench formation to realize high density elements, then a trench having angular portions with a small radius of curvature is formed and the electric field concentrates on that angular portions with small radius of curvature. As a result, the withstand voltage of the capacitor insulating film disadvantageously deteriorates.

Moreover, if the diameter of the trench is smaller and smaller, the thickness of the arsenic doped glass film which is the source of the solid phase diffusion cannot be ensured in a sufficient way. As a result, it is difficult to form an impurity diffused layer of high impurity concentration on the surface of the trench.

If the arsenic doped glass film is deposited deep enough to embed the trench therewith to ensure the above-stated film thickness of the arsenic doped glass film, the impurity diffused layer of high impurity concentration is not necessarily formed. If formed, this causes the problem that it is difficult to peel off the arsenic doped glass in the later step.

If the diameter of the trench is smaller, the following problems also occur. Namely, when an arsenic doped amorphous silicon film is embedded into the trench, voids occur which cause problems in later manufacturing steps.

Specifically, provide that a plurality of trench capacitors are formed and elements are isolated in a region including the two trenches by Shallow Trench Isolation (to be described later and referred to as STI hereinafter). In this case, the arsenic doped amorphous silicon film present in the above-stated region is etched away and thermal oxidation is conducted onto the entire portion. During the etching process, voids occur within the arsenic doped amorphous silicon film and the portions of the arsenic doped amorphous silicon film where the voids appear are oxidized to thereby generate defects.

In the manufacturing process of semiconductor chips having trench structure, the number of steps is increasing to ensure necessary capacity. The increased number of steps needs to be reduced by adopting effective process.

Meanwhile, element isolation is conducted by using one of the local oxidation methods, i.e., LOCOS element isolation. According to the LOCOS element isolation,, the oxide film bites into the element formation region, which phenomenon is called bird's beak, and the effective area of the element formation region decreases. For that reason, the LOCOS element isolation is not effective for high integration purposes.

In view of the above, the STI has been widely used in recent years. The STI is the method by which a shallow groove serving as an element separation trench is formed on the surface of the substrate and the shallow trench is filled with the element isolation insulating film. Unlike the LOCOS element isolation, the STI does not cause a bird's beak. Due to this, a decrease in the area of the element formation region is prevented, which is therefore suitable for high integration purposes.

The conventional STI has, however, the following problems. The trench of this type is formed by RIE, and uneven portions are generated on the inner surface of the trench.

As a result, the phenomenon that part of the channel of the MOS transistor cell is turned on earlier than the rest and that transistor characteristics thereby deteriorate. In addition, since it becomes difficult to embed a favorable shaped element isolation insulating film into the trench, defective element isolation occurs and reliability deteriorates.

BRIEF SUMMARY OF THE INVENTION

It is therefore the first object of the present invention to provide a semiconductor device having a trench suitable for smaller-sized elements, and to provide a manufacturing method thereof.

It is the second object of the present invention to provide a method of manufacturing a semiconductor device wherein only the surface of a desired exposed silicon region is made smoother than those of other plural exposed silicon regions.

To attain the above-stated objects, a semiconductor device in the first aspect according to the present invention comprises:

a semiconductor substrate having a trench on a surface thereof; and an embedding member embedding an interior of the trench therewith, and is characterized in that while a section of the trench when cut by a first plane perpendicular to a direction of a depth of the trench is defined as a first section, and a section of the trench when cut by a second plane perpendicular to the direction of the depth of the trench and closer to a bottom of the trench than the first plane is defined as a second section, an area of the first section is smaller than an area of the second section and a minimum radius of curvature of the first section is smaller than a minimum radius of curvature of the second section.

A semiconductor device in the second aspect according to the present invention comprises:

a semiconductor substrate having a trench with an aspect ratio of 10 or more on a surface thereof; and an embedding member embedding an interior of the trench therewith, and is characterized in that while a section of the trench when cut by a first plane perpendicular to a direction of a depth of the trench at a position away from a bottom of the trench by a distance corresponding to ⅕ of the depth of the trench in a direction of the surface is defined as a first section and a section of the trench when cut by, a second plane perpendicular to the direction of the depth of the trench at a position away from the bottom of the trench by a distance corresponding to ⅕ of the depth of the trench in the direction of the surface is defined as a second section, a value obtained by dividing a major diameter of the second section by a minor diameter of the second section is smaller than 1.1 times of a value obtained by dividing a major diameter of the first section by a minor diameter of the first section.

To be specific, in the first and second aspects, the trench is, for example, the trench of a trench capacitor or an element separation groove.

If the present invention is applied to a trench capacitor having a collar insulating film, using a rectangular mask for etching the trench, the capacitor has the following features.

The sectional shape of the trench when cutting the trench by a plane parallel to the surface of the substrate is rectangular as in the case of the mask if the collar insulating film is present. The trench located deeper than the collar oxide film has a larger minimum radius of curvature and a smoother shape than in case the collar insulating film is present.

A semiconductor device in the third aspect according to the present invention comprises:

a semiconductor substrate having a trench on a surface thereof; and an embedding member embedding an interior the trench therewith, and is characterized in that when the trench is cut through a substantial center thereof, the semiconductor device has a vertically asymmetric sectional shape about the substantial center of the trench.

A semiconductor device manufacturing method in the fourth aspect according to the present invention comprises the steps of:

forming a trench on a surface of a semiconductor substrate;

deforming the trench by a thermal treatment under reduced pressure such that, while a section of the trench when cut by a first plane perpendicular to a direction of a depth of the trench is defined as a first section and a section of the trench when cut by a second plane perpendicular to the direction of the depth of the trench and closer to a bottom of the trench than the first plane is defined as a second section, an area of the first section is smaller than an area of the second section and that a minimum radius of curvature of the first section is smaller than a minimum radius of curvature of the second section; and embedding an interior of the trench with an embedding member.

A semiconductor device manufacturing method in the fifth aspect according to the present invention comprises the steps of:

forming a trench on a surface of a semiconductor substrate;

deforming the trench by a thermal treatment under reduced pressure such that, while a section of the trench when cut by a first plane perpendicular to a direction of a depth of the trench at a position away from a bottom of the trench by a distance corresponding to ⅕ of the depth of the trench in a direction of the surface is defined as a first section and a section of the trench when cut by a second plane perpendicular to a direction of the depth of the trench at a position away from the bottom of the trench by a distance corresponding to ⅕ of the depth of the trench in the direction of the surface is defined as a second section, a value obtained by diving a major diameter of the second section by a minor diameter of the second section is smaller than 1.1 times of a value obtained by dividing a major diameter of the first section by a minor diameter of the first section; and embedding an interior of the trench with an embedding member.

The step of embedding the interior of the trench with the embedding member can include:

a step of forming an impurity defused layer, serving as a first capacitor electrode, on an inner surface of the trench by diffusing impurities into the inner surface of the trench; and a step of embedding the interior of the trench with a second capacitor electrode through a capacitor insulating film.

In the semiconductor device manufacturing method in the fourth and fifth aspects, the impurity diffused layer is preferably formed by diffusing the impurities into the inner surface of the trench by a thermal treatment under the atmosphere of gas containing the impurities.

It is also preferable that thermal treatment under reduced pressure and the thermal treatment under the atmosphere of gas containing the impurities are continuously conducted in the same vacuum chamber.

The thermal treatment under reduced pressure is preferable conducted at a temperature of not lower than 850° C. and not higher than 1200° C., more preferably 1100° C.

The thermal treatment under reduced pressure is preferably conducted under the gas atmosphere where the surface of the semiconductor substrate is reduced. Specifically, it is preferably conducted under the gas atmosphere where $SiO_2$ is reduced.

Moreover, the thermal treatment under reduced pressure is conducted under the hydrogen atmosphere.

A semiconductor device manufacturing method in the sixth aspect according to the present invention comprises the steps of:

forming a first trench on a surface of a semiconductor substrate;

separating the first trench into a plurality of cells arranged to be distant from one another substantially along a center line of the first trench by a first thermal treatment under reduced pressure;

forming a second trench on the surface of the semiconductor substrate so as to include part of each of the plurality of cells;

smoothing an interior of the second trench by a second thermal treatment under the reduced pressure to thereby deform the second trench into a trench having a vertically asymmetric sectional shape about a substantial center line of the second trench; and embedding the interior of the trenches with an embedding member.

In this case, the first thermal treatment is preferably conducted at a temperature of 1100° C., more preferably 1200° C. or higher.

The second thermal treatment is preferably conducted at a temperature of not lower than 850° C. and not higher than 1200° C., more preferably 1100° C.

In addition, it is preferable that the surface of the substrate is flattened after the first thermal treatment and then the second trench is formed. Specifically, a semiconductor film is deposited on the entire surface and the surface of the semiconductor film is flattened by the thermal treatment under reduced pressure.

According to the study by the inventors of the present invention, it has been discovered that the shape of the trench formed on the surface of the substrate can be deformed into a shape suitable for smaller-sized elements by the thermal treatment under reduced pressure.

Namely, it has been discovered that angular portions of the trench, in particular, those at the bottom thereof can be rounded by the thermal treatment under reduced pressure. The deformation of the shape of the trench mentioned above makes it possible to relax the electric field concentration and to thereby improve the withstand voltage.

Furthermore, it has been discovered that uneven portions formed on the side surface of the trench during etching can be eliminated by the thermal treatment under reduced pressure, thereby providing a smoother side surface of the trench.

The effect of relaxing the electric field concentration can provide improved withstand voltage even if the trench is smaller and smaller.

Moreover, the trench is usually formed by etching such as RIE and is tapered as the etching progresses. When thermal treatment under reduced pressure was conducted onto a semiconductor substrate having a trench of this type, the inventors has discovered the following.

The tapered trench could be deformed such that the section area of the trench at a position close to its bottom is larger than that at a position distant from the bottom. The deformation of the shape as stated above makes it possible to improve the embedding shape of the embedding member. If so, elements such as a trench capacitor can be made smaller in size.

The first aspect according to the present invention relates to the characteristic deformation of the shape of the trench. FIGS. 33A through 33C typically show the trench of the present invention. FIG. 33A is the sectional view of the trench including the central axis in the depth direction of the trench. (The convex portion at the bottom thereof is not illustrated in FIG. 33A.) The plane shape at a section perpendicular to the central axis of the trench is elliptical in upper portion (FIG. 33B) and the lower portion (FIG. 33C) of the trench. If the major diameter of the upper elliptical shape is defined as Dlb and the minor diameter thereof as Dsb, and the major diameter of the lower elliptical shape is defined as Dlc and the minor diameter thereof as Dsc, the trench of the present invention satisfies the relationship expressed by the following formula:

$$(Dlc/Dsc)/(Dlb/Dsb)<1.1 \qquad (1)$$

This indicates that the elliptical shape is closer to a complete round at the bottom of the trench.

FIG. 34A typically shows the section of the trench formed by using a rectangular exposure mask and the RIE. Even if the rectangular exposure mask is used, an etching mask having a elliptical opening portion is formed due to uneven exposure with the current exposure technique (FIG. 34B).

According to the RIE using this etching mask, the initial (or upper) portion of the substrate is etched to an elliptical shape (FIG. 34C). However, if etched deeper, the dependency of the substrate on surface orientation appears and the substrate is etched to a rectangular shape (FIG. 34D).

Thus, the trench formed by the RIE and having an aspect ratio of 10 or more has an elliptical sectional shape at the upper portion (⅘ of the depth of the trench from the bottom) and a rectangular sectional shape at the lower portion (⅕ of the depth of the trench from the bottom).

According to the experiments made by the inventors of the present invention, a minimum radius of curvature of the lower portion of the trench was 25 nm or more. When the thermal treatment under reduced pressure according to the present invention was conducted, by contrast, it was discovered that a minimum radius of curvature of the lower portion of the trench was 150 nm or more. In other words, it has been confirmed that the thermal treatment under reduced pressure makes it possible to round the sharpest angular portions and to deform the shape of the trench into a shape with which the electric field concentration hardly occurs.

FIGS. 34A through 34D show states prior to the thermal treatment under reduced pressure. It is noted that after thermal treatment is conducted, the states are as shown in FIGS. 33A through 33C.

The fourth and fifth aspects according to the present invention are a method of forming a trench capacitor using the trench in the first and second aspects according to the present invention as the trench of the trench capacitor.

In this case, an impurity diffused layer (or a first capacitor electrode) is preferably formed by the thermal treatment under the atmosphere of gas containing impurities as a dopant, i.e., by impurity diffusion from the vapor phase.

In this method stated above, impurities can be always supplied to the inner surface of the trench from the vapor phase. Due to this, even if the diameter of the trench is small (or the aspect ratio of the trench is high), an impurity diffused layer having necessary impurity concentration can be easily formed.

The thermal treatment under reduced pressure is preferably conducted at a temperature of not lower than 850° C. and not higher than 1200° C., more preferably 1100° C. The reason is, in case of the silicon substrate, the surface migration of silicon occurs under reduced pressure at 850° C. or higher and the trench is separated into upper and lower portions under reduced pressure at a temperature higher than 1200° C., or 1100° C. under some conditions.

In addition, the thermal treatment under reduced pressure is preferably conducted under the reducing gas atmosphere. The reason is that, if the semiconductor substrate is oxidized and an oxide film is formed on the surface of the substrate, then the migration phenomenon of constituent elements of the semiconductor substrate is hampered and the deformation of the shape of the trench is thereby suppressed.

Moreover, the thermal treatment under reduced pressure and that under the atmosphere of gas containing impurities as a dopant are preferably conducted under vacuum in a continuous manner.

The reason is that the native oxide film formed on the surface of the substrate is removed while the thermal treatment under reduced pressure is being conducted. If the thermal treatment is conducted under the atmosphere of gas containing impurities as a dopant while maintaining the state in which the native oxide film is removed, it is possible to decrease the number of manufacturing steps without the need to add another step for removing the native oxide film.

Additionally, if the trench has an asymmetric sectional shape as in the case of the present invention, the surface area of the asymmetric sectional shape is larger than that of the symmetric sectional shape under the condition of the same depth. Due to this, if such an asymmetric trench is applied to, for example, the trench of a trench capacitor, necessary capacity can be ensured even if elements are made smaller in size.

A semiconductor device manufacturing method in the seventh aspect according to the present invention comprises the steps of:

forming a first silicon region and a second silicon region on a silicon substrate, a surface of each of the first and the second silicon region being exposed;

forming a protection film consisting of carbon on the first silicon region; and making the surface of the second silicon region smoother by a thermal treatment under reduced pressure.

The step of forming the first silicon region and the second silicon region preferably includes a step of forming a polycrystalline silicon gate electrode as the first silicon region on the silicon substrate and forming a trench as the second silicon region on the surface of the silicon substrate.

The step of forming the protection film preferably includes:

a step of forming a base film on the second silicon region;

a step of forming the protection film on an entire surface; and a step of removing the protection film on the second silicon region by removing the base film.

The step of making the surface of the second silicon region smoother preferably includes a step of removing the base film by the thermal treatment.

The step of making the surface of the second silicon region smoother preferably includes a step of conducting the thermal treatment under reduced pressure in a reducing gas atmosphere.

The study made by the inventors of the present invention has discovered that carbon does hardly react to the silicon film and is attached to the surface of the silicon surface to thereby form a film and that the film formed by the attachment of the carbon to the surface can be selectively removed without difficulty. It has been also discovered that such carbon characteristics are not related to crystalline states of the silicon film, that is, monocrystalline, polycrystalline and amorphous states.

According to the seventh aspect of the present invention, therefore, the thermal treatment under reduced pressure enables only the surface of the a desired silicon region (the second silicon region) to be made smoother and the unnecessary protection film to be easily removed in the later steps.

If, for example, the surface of the polycrystalline silicon gate electrode and the surface of the trench are selected as the first silicon region and the second silicon region, respectively, the deformation of the shape of the polycrystalline silicon gate electrode can be prevented when the surface of the trench is smoothed by the thermal treatment under reduced pressure.

If an element isolation groove is selected as the trench, it is possible to prevent the phenomenon that part of the channel of a transistor is turned on earlier than the rest and to prevent defective element isolation. If the trench of the trench capacitor is selected as the trench, it is possible to prevent the withstand voltage of the capacitor insulating film from lowering.

Further, to form a protection film on the first silicon region selectively, the protection film on the second silicon region may be removed by first forming a base film on the second silicon region, next forming the protection film on the entire surface and finally removing the base film.

In this case, for purposes of reducing the number of steps, it is preferable that not only the base film on the second silicon region is removed but also the surface of the exposed second silicon region is made smoother by the thermal treatment under reduced pressure.

If so, the base film is preferably a thin oxide film. This is because a thin oxide film can be easily removed if the thermal treatment under reduced pressure, high temperature and hydrogen atmosphere is selected.

It is also preferable that the thermal treatment under reduced pressure is conducted under the reducing gas atmosphere. The reason is that the oxidation of the second silicon region is suppressed under the reducing gas atmosphere while the surface migration which provides the smoother surface of the second silicon region is not suppressed.

Furthermore, the unnecessary protection film after the thermal treatment can be easily removed with a solution mixture of, for example, sulfuric acid and hydrogen peroxide.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 6A typically shows the longitudinal sectional view of the trench before thermal treatment, when seen from the minor edge side of the trench;

FIG. 6B is a cross-sectional view taken along line 6B—6B of FIG. 6A;

FIG. 6C is an enlarged view of part 6C of FIG. 6A;

FIG. 7A typically shows the longitudinal sectional view of the trench after thermal treatment, when seen from the minor edge side of the trench;

FIG. 7B is a cross-sectional view taken along line 7B—7B of FIG. 7A;

FIG. 7C is an enlarged view of part 7C of FIG. 7A;

FIG. 12 is a view drawn based on a microphotograph (SIM, tilt angle: 30°) of a surface which appeared when cutting the trench at a plane perpendicular to the depth direction at a position away from the bottom of the trench by a distance corresponding to ⅕ of the depth of the trench prior to thermal treatment;

FIG. 13 is a view drawn based on a microphotograph (SIM, tilt angle: 30°) after thermal treatment of FIG. 12;

FIG. 14 is a view drawn based on a microphotograph (SIM, tilt angle: 30°) of a surface which appeared when cutting the trench at a plane perpendicular to the depth direction at a position away from the bottom of the trench by a distance corresponding to ⅘ of the depth of the trench prior to thermal treatment;

FIG. 15 is a view drawn based on a microphotograph (SIM, tilt angle: 30°) after thermal treatment of FIG. 14;

FIG. 16A is a view drawn based on a microphotograph showing the sectional shape of the overall trench prior to thermal treatment in case a silicon oxide film is used as a collar insulating film;

FIG. 16B is a view drawn based on a microphotograph of the trench of FIG. 16A after thermal treatment;

FIG. 17A is a view drawn based on a microphotograph showing the sectional shape of the central portion of the trench prior to thermal treatment in case a silicon oxide film is used as a collar insulating film;

FIG. 17B is a view drawn based on a microphotograph of the trench shown in FIG. 17A after thermal treatment;

FIG. 24A is a view drawn based on the microphotograph of the sectional view of the trench prior to the first thermal treatment;

FIG. 24B is a view drawn based on the microphotograph of the sectional view of the trench after the first thermal treatment;

FIG. 25 shows the dependency of the sectional shape of the trench (X/Y) on temperature with regard to the thermal treatment;

FIG. 26 shows the dependency of the sectional shape of the trench (X/Y) on pressure with regard to the thermal treatment;

FIG. 30A is a plan view showing another layout of the trenches;

FIG. 30B is a longitudinal sectional view taken along line 30B—30B of FIG. 30A;

FIG. 30C is a longitudinal sectional view showing the state of the trench of FIG. 30B after the thermal treatment;

FIGS. 31A and 31B are longitudinal sectional views showing a trench alignment method by stages;

FIG. 33A is a typical longitudinal sectional view for illustrating the features of the trench according to the present invention;

FIG. 33B is a cross-sectional view taken along line 33B—33B of FIG. 33A;

FIG. 33C is a cross-sectional view taken along line 33C—33C of FIG. 33A;

FIG. 34A is a longitudinal sectional view for typically showing the trench formed by using a rectangular exposure mask and RIE;

FIG. 34B is a cross-sectional view taken along line 34B—34B of FIG. 34A;

FIG. 34C is a cross-sectional view taken along line 34C—34C of FIG. 34A;

FIG. 34D is a cross-sectional view taken along line 34D—34D of FIG. 34A;

FIGS. 35A through 35H are sectional views showing the semiconductor device manufacturing method in the third embodiment according to the present invention by stages;

FIGS. 36A and 36B are views drawn based on the microphotographs of the sectional views of the trench prior to and after the thermal treatment under reduced pressure; and FIG. 37 is a characteristic view showing the relationship between the annealing temperature and the surface roughness of a polycrystalline silicon film.

DETAILED DESCRIPTION OF THE INVENTION

Embodiments of the present invention will be described with reference to the drawings.

[First Embodiment]

Figure 1A:
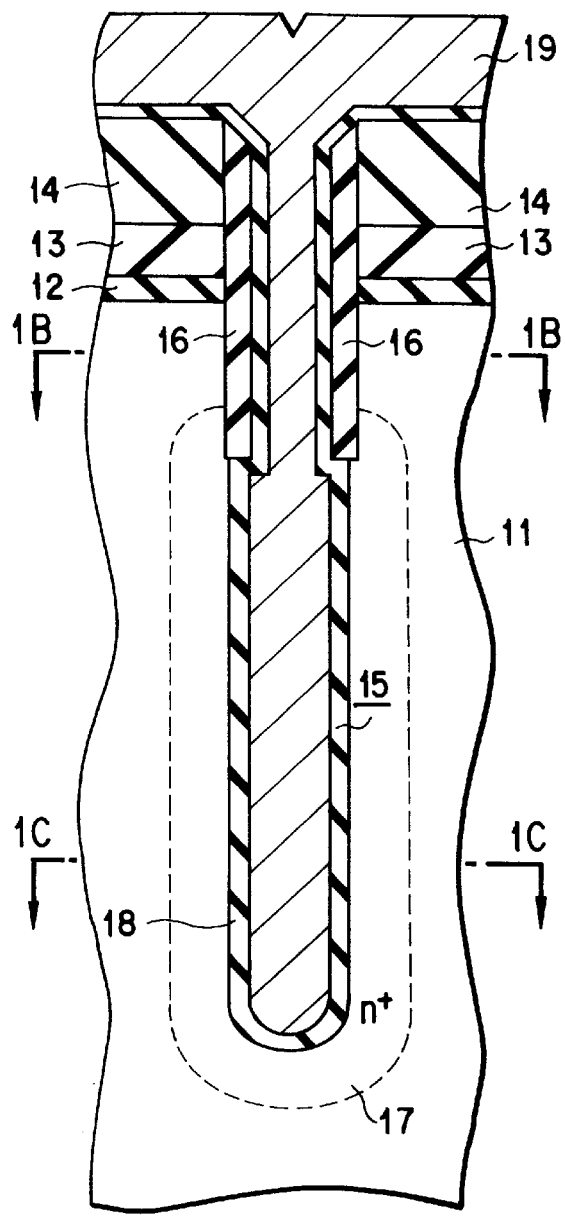
FIG. 1A is a longitudinal sectional view of a trench capacitor in the first embodiment according to the present invention.

FIG. 1A is the sectional view of a trench capacitor in the first embodiment according to the present invention.

In FIG. 1A, reference numeral 11 denotes a silicon substrate, on which a silicon nitride film 13 and an insulation mask of an $SiO_2$ film 14 are formed through a thin $SiO_2$ film 12.

A trench 15 of an aspect ratio of 10 or more is formed in the silicon substrate 11. A collar insulating film 16 is formed from the upper side wall of the trench 15 to the side wall of the insulation mask. The trench 15 is formed by the RIE using the collar insulating film 16 and the above-state insulation mask as etching masks.

Figure 1B:
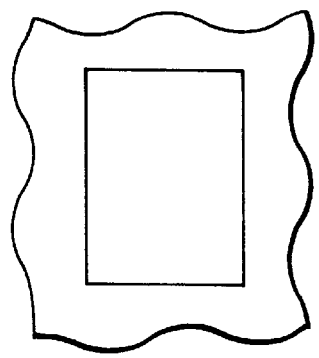
FIG. 1B is a cross-sectional view taken along line 1B—1B of FIG. 1A, showing an outline of the trench.
Figure 1C:
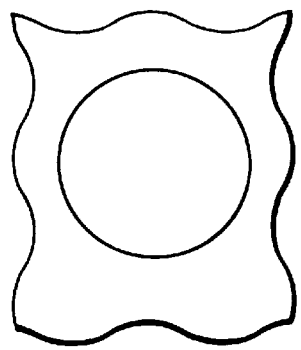
FIG. 1C is a cross-sectional view taken along line 1C—1C of FIG. 1A, showing an outline of the trench.

FIG. 1B shows the sectional view of the trench 20 which is taken along line 1B—1B of FIG. 1A and which is seen from the top of the silicon substrate 11. FIG. 1C is the sectional view of the trench 15 which is taken along line 1C—1C of FIG. 1A and which is seen from the top of the silicon substrate 11.

In FIG. 1B, the shape of the trench 15 in a state in which the collar insulating film 16 has been formed is rectangular (to be exact, generally elliptical) corresponding to the insulating mask. The trench 15 located below the collar insulating mask 16 is of a circular shape having a larger minimum radius of curvature than that of the rectangular shape mentioned above. This derives from the thermal treatment under reduced pressure, high temperature, hydrogen atmosphere which will be described later.

An n-type impurity diffused layer 17 of high impurity concentration which serves as a capacitor electrode (or plate electrode) is formed on the inner surface of the trench 15 by impurity diffusion from gaseous phase. An arsenic doped amorphous silicon film 19 (embedding member) which serves as a storage electrode (or storage node electrode) is embedded through a capacitor insulating film 18 (embedding member) into the trench 15.

The capacitor formation method in the first embodiment will now be described. FIGS. 2A through 2E are sectional views showing the formation method by stages.

Figure 2A:
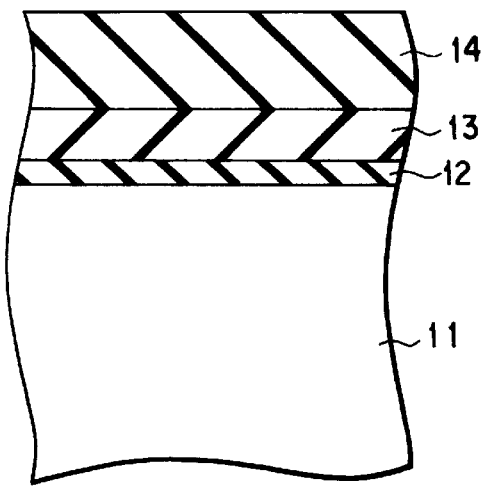
FIGS. 2A through 2E are longitudinal sectional views of the trench capacitor, showing the method of forming a trench capacitor shown in FIG. 1A by stages.

First, as shown in FIG. 2A, a thin $SiO_2$ film 12 is formed on the surface of the silicon substrate 11 and, then a silicon nitride film 13 and an $SiO_2$ film 14 are sequentially formed on the $SiO_2$ film 12.

Figure 2B:
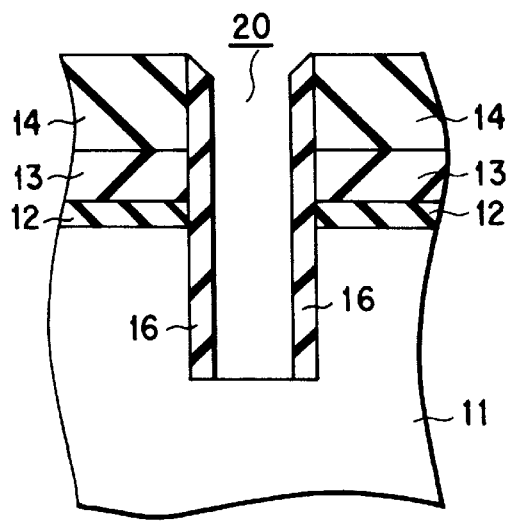

Next, the $SiO_2$ film 12, the silicon nitride film 13 and the $SiO_2$ film 14 are patterned and an insulation mask consisting of the $SiO_2$ film 12, the silicon nitride film 13 and the $SiO_2$ film 14 and having a rectangular opening. Thereafter, using the insulation mask as an etching mask, the silicon substrate 11 is etched and thereby a trench 20 of 1.5 μm in depth is formed (FIG. 2B).

A collar insulating film 16 consisting of, for example, $Si_3N_4$ is formed on the side wall of the trench 20. The collar insulating film 16 is formed by the so-called sidewall formation technique. The insulating film as the collar insulating film 16 is deposited on the entire surface so as to cover the side wall of the trench 20 and the entire surface of the insulating film is etched by RIE, thereby selectively leaving the insulating film on the side wall of the trench (FIG. 2B).

For brevity, the $SiO_2$ film 12, the silicon nitride film 13 and the $SiO_2$ film 14 are denoted by a single insulating film 21 in the drawings hereinafter.

Figure 2C:
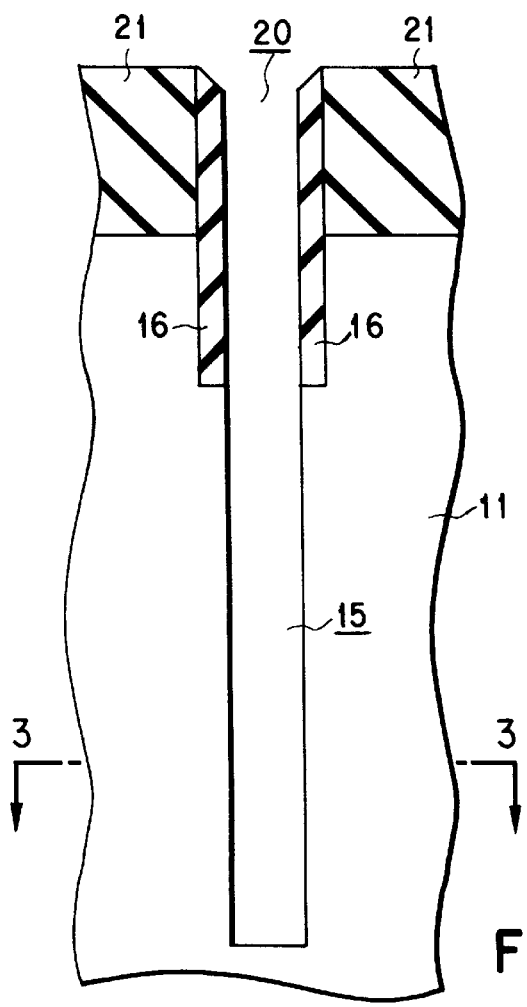

Now, using the insulating mask (the silicon nitride film and the $SiO_2$ film) and the collar insulating film 16 as etching masks, the silicon substrate 11 is etched and a trench 15 of 7 μm in depth is thereby formed in the silicon substrate 11 (FIG. 2C).

Figure 3:
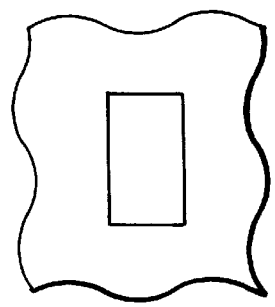
FIG. 3 is a cross-sectional view taken along line 3—3 of FIG. 2C.

FIG. 3 is the sectional view of the trench 15 which is taken along line 3—3 of FIG. 2C and which is seen from the top of the silicon substrate 11. As is seen from FIG. 3, the trench 15 located below the collar insulating film 16 is rectangular at this stage.

Next, to remove the native oxide film, the silicon substrate 11 is subjected to treatment with a hydrogen fluoride aqueous solution. Thereafter, the silicon substrate is placed within the chamber. Thermal treatment is conducted within the chamber in which only hydrogen of 10 slm is introduced under pressure of 380 Torr, at 1000° C. for 600 seconds.

At this time, the native oxide film formed on the surface of the silicon substrate 11 by the time the silicon substrate 11 is placed into the chamber, is removed and the silicon on the surface of the substrate is exposed. Due to this, the surface migration of silicon that provides a minimum surface occurs.

Through the silicon surface migration mentioned above, the trench 15 is deformed such that it is compressed in the major diameter direction and expanded in the minor diameter direction.

In other words, the trench 15 after thermal treatment has a shape obtained by deforming the (rectangular) shape at the time of forming the trench 15 shown in FIG. 2C into an (elliptical) shape having a larger minimum radius of curvature. As a result, the angular portions of the trench 15 are rounded.

Figure 4A:
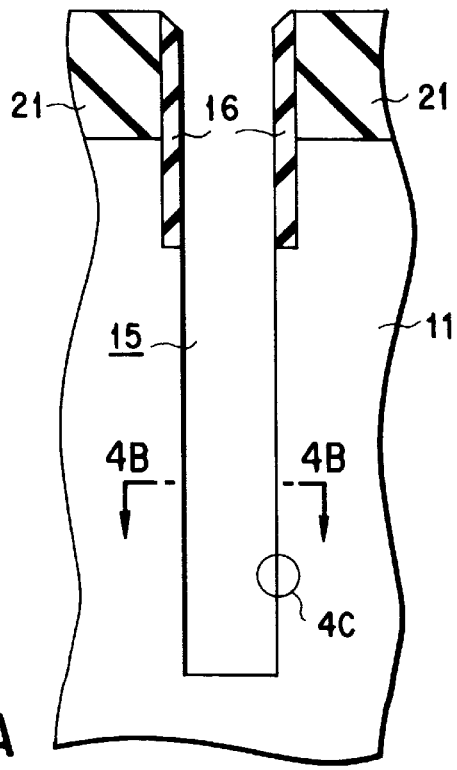
FIG. 4A typically shows the longitudinal sectional view of the trench prior to thermal treatment, when seen from the major edge side of the trench.
Figure 4B:
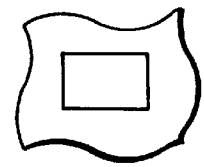
FIG. 4B is a cross-sectional view taken along line 4B—4B of FIG. 4A.
Figure 4C:
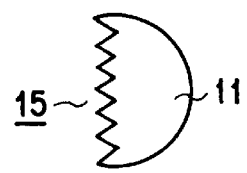
FIG. 4C is an enlarged view of part 4C of FIG. 4A.
Figure 5A:
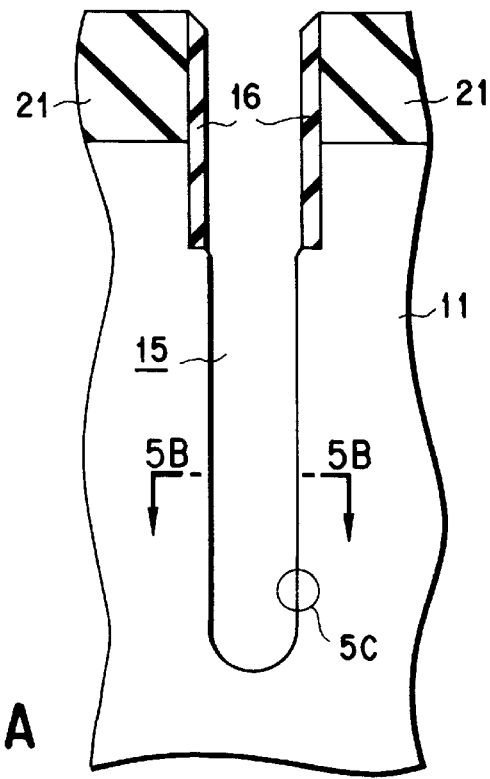
FIG. 5A typically shows the longitudinal sectional view of the trench after thermal treatment, when seen from the major edge side of the trench.
Figure 5B:
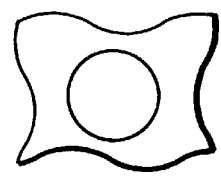
FIG. 5B is a cross-sectional view taken along line 5B—5B of FIG. 5A.
Figure 5C:
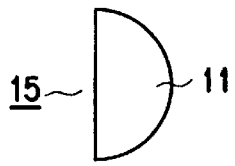
FIG. 5C is an enlarged view of part 5C of FIG. 5A.

FIGS. 4A through 4C and 5A through 5C are sectional views of the trench after thermal treatment when seen from the major edge side of the trench 15. FIG. 4A is the sectional view of the trench prior to thermal treatment. FIG. 4B is a view of the section of the trench taken along line 4B—4B of FIG. 4A and seen from the top. FIG. 4C is an enlarged view of part 4C of FIG. 4A. FIG. 5A is the sectional view of the trench after thermal treatment. FIG. 5B is a view of the section of the trench taken along line 5B—5B of FIG. 5A. FIG. 5C is an enlarged view of part 5C of FIG. 5A.

As can be seen from FIGS. 4C and 5C, the uneven portions formed on the inner surface of the trench 15 as a result of RIE have been eliminated by thermal treatment. After thermal treatment, therefore, the inner surface of the trench 15 is smooth with little roughness.

The trench prior to deformation and that after deformation by thermal treatment under the above conditions were observed by sectional Scanning Electron Microscopy (to be referred to as SEM hereinafter). FIGS. 8 through 11 show the examination results. FIGS. 8 through 11 correspond to FIGS. 4A, 5A, 6A and 7A, respectively.

Figure 8:
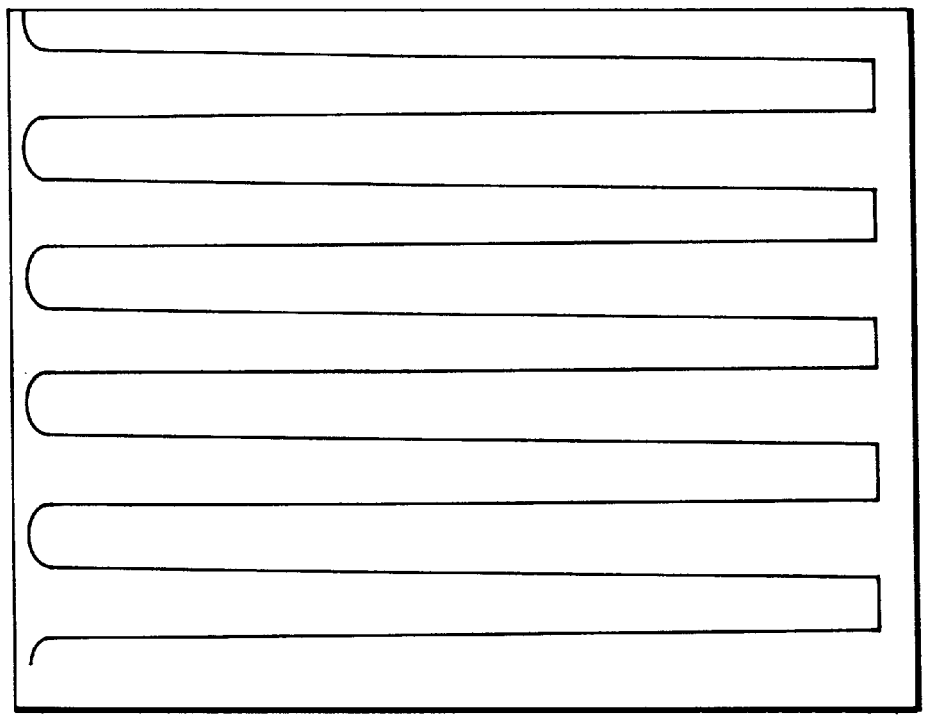
FIG. 8 is a view drawn based on the microphotograph of the longitudinal sectional view of the trench prior to thermal treatment, when seen from the major edge side of the trench.
Figure 9:
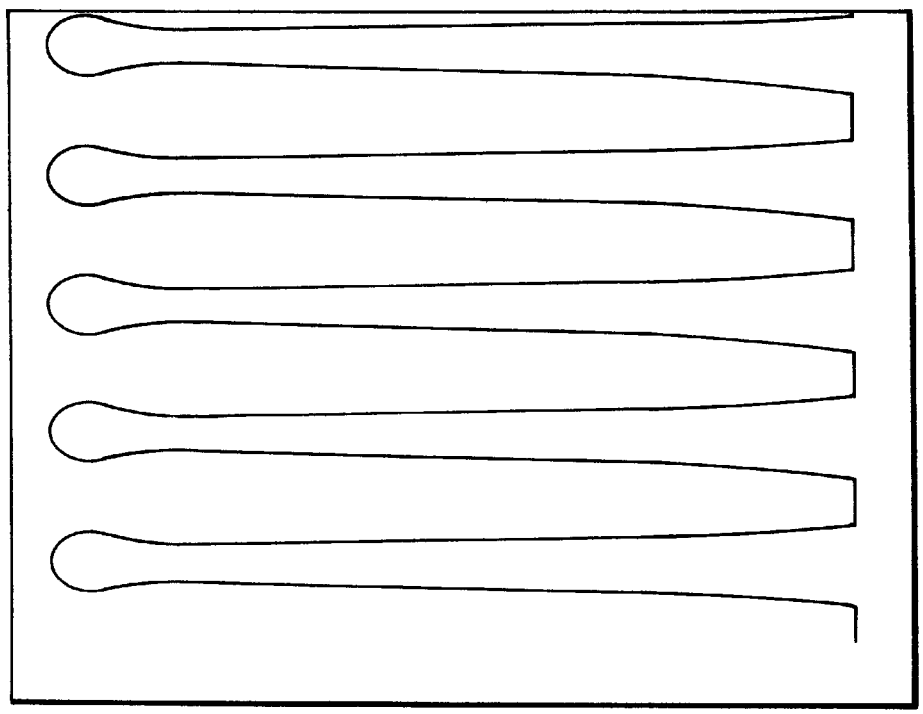
FIG. 9 is a view drawn based on the microphotograph of the longitudinal sectional view of the trench after thermal treatment, when seen from the major edge side of the trench.
Figure 10:
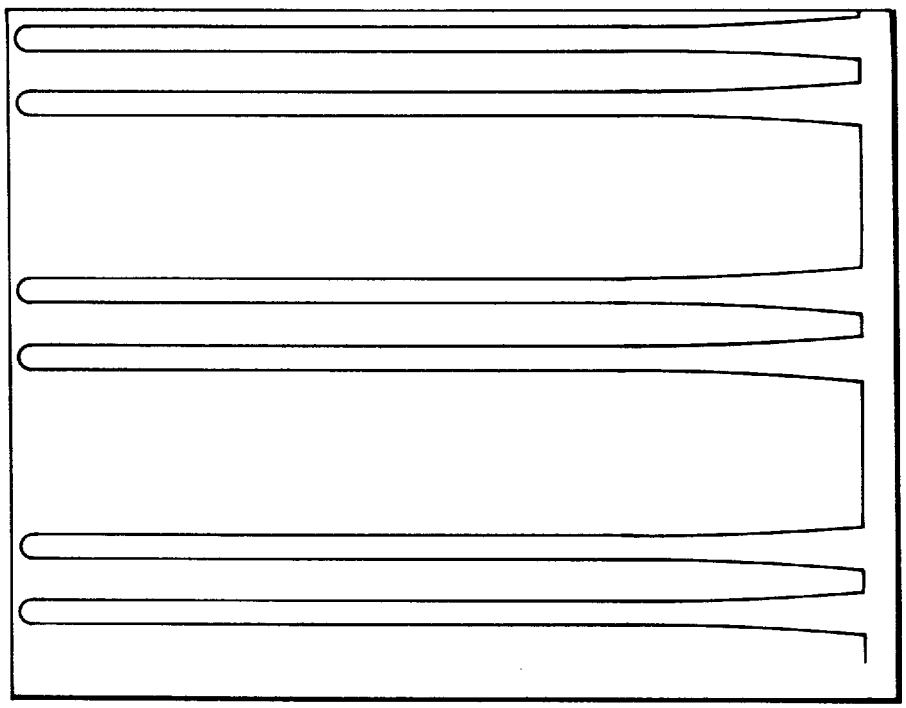
FIG. 10 is a view drawn based on the microphotograph of the longitudinal sectional view of the trench prior to thermal treatment, when seen from the minor edge side of the trench.
Figure 11:
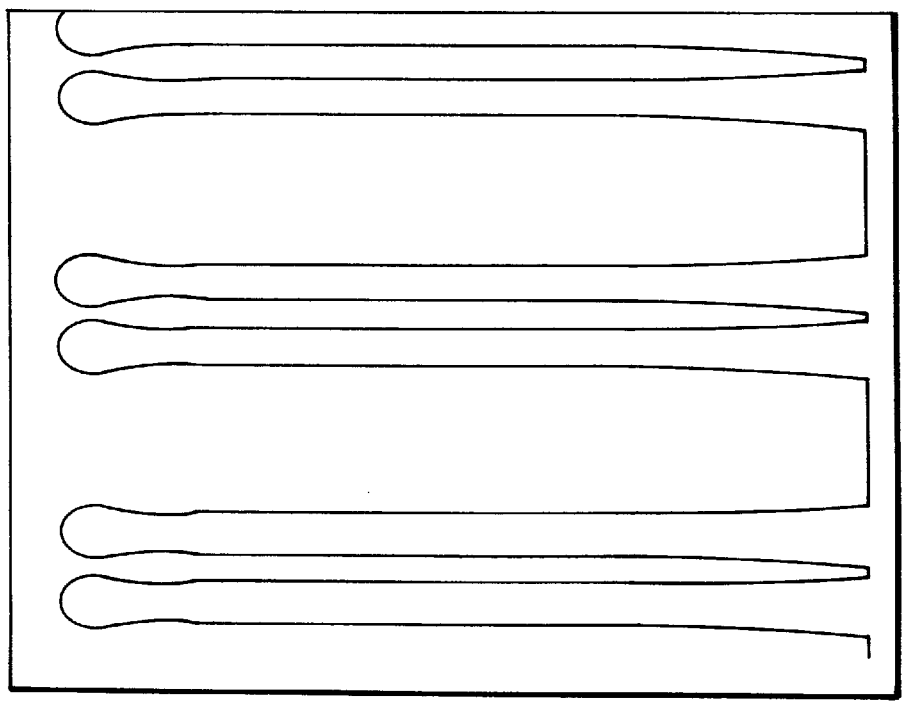
FIG. 11 is a view drawn based on the microphotograph of the longitudinal sectional view of the trench after thermal treatment, when seen from the minor edge side of the trench.

As shown in FIGS. 8 and 10, the trench 15 is tapered as the RIE progresses. As shown in FIGS. 9 and 11, the bottom of the trench 15 is deformed such that a section area in the vicinity of the bottom is larger than that distant from the bottom. A formula (1) described with reference to FIGS. 33A through 33C in the Summary of the Invention is obtained from the SEM photograph.

The deformation of the shape stated above enables an improvement in the embedding shape of the embedding member. This can make it possible to provide smaller-sized elements including a trench capacitor.

The trench 15 was further observed by Scanning Ion Microscopy (to be referred to as SIM hereinafter) (at tilt angle: 30°). The results are shown in FIGS. 12 through 15.

FIG. 12 shows a surface appearing after cutting the prior-to-treatment trench at a plane perpendicular to the trench depth direction on a position away from the bottom of the trench by a distance corresponding to 1/5 of the depth thereof, and FIG. 13 shows a surface of the trench of FIG. 12 after thermal treatment.

FIG. 14 shows a surface appearing after cutting the prior-to-treatment trench at a plane perpendicular to the trench depth direction on a position away from the bottom of the trench by a distance corresponding to 4/5 of the depth thereof, and FIG. 15 shows a surface of the trench of FIG. 12 after thermal treatment.

It is noted that FIGS. 12 through 15 which are seen at an tilt angle of 30°, are deformed views. That is, the shape which looks like elliptical after thermal treatment (FIGS. 13 and 15) is generally circular if seen from the top.

FIGS. 16A, 16B, 17A and 17B are views drawn based on the micrographic photograph (section SEM) of the trench 15 after thermal treatment mentioned above while a silicon oxide film is used as a collar insulating film 16. FIGS. 16A and 16B show the overall trench, and 17A and 17B show the central portion of the trench. FIGS. 16A and 17A show the trench 15 prior to thermal treatment whereas FIGS. 16B and 17B show the trench 15 after thermal treatment. As can be seen from these drawings, thermal treatment provides the less rough or smooth surface of the trench 15.

Figure 2D:
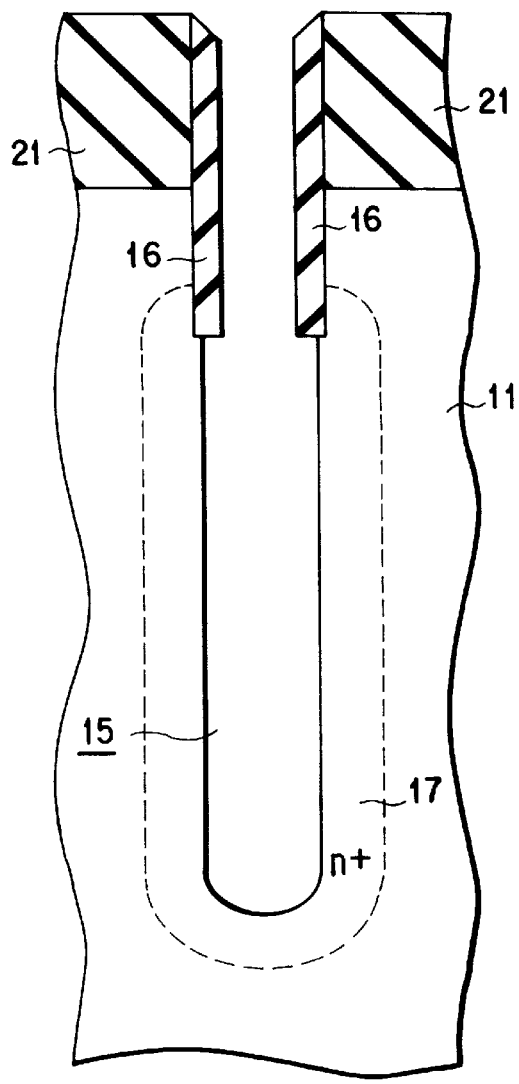

Next, 500 sccm $PH_3$ (phosphine) diluted to 1% by hydrogen is introduced into the chamber which has been thermally treated as stated above and the pressure within the chamber is set to 200 Torr. In this state, thermal treatment is conducted at 1000° C. for 300 seconds. As shown in FIG. 2D, an n-type impurity diffused layer 17 of high impurity concentration serving as a capacitor electrode (or plate electrode) is formed on the inner surface of the trench 15.

In this case, the above-stated two series of thermal treatment are continuously conducted in the same chamber while the silicon substrate 11 is prevented from being exposed to the atmospheric air.

Figure 2E:
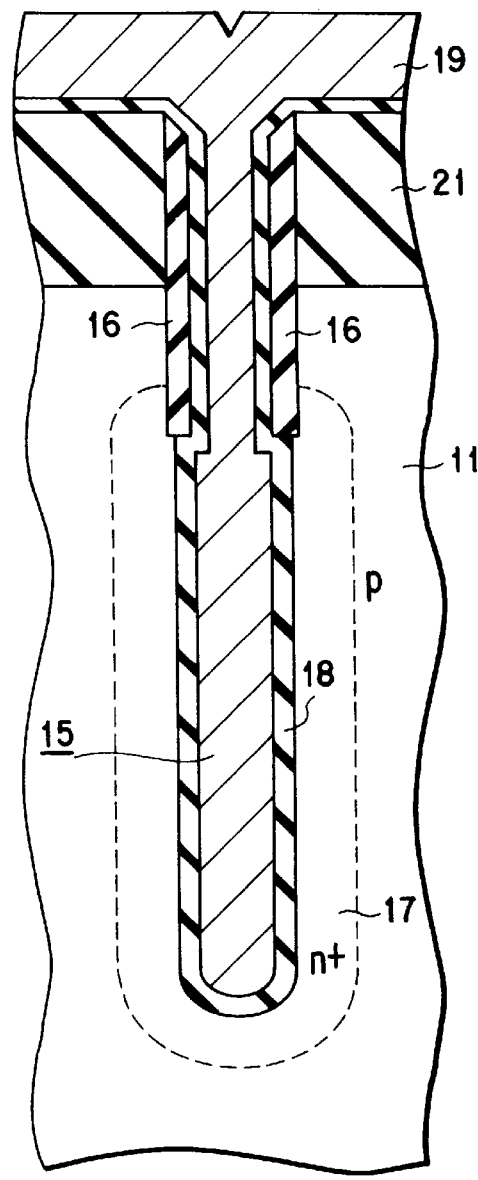

Lastly, as shown in FIG. 2E, a capacitor insulating film 18 made of $SiO_2$ to cover the inner surface of the trench 15 is formed. Thereafter, an arsenic amorphous silicon film 19 serving as a storage electrode (or storage node) is embedded into the trench 15 and the trench capacitor is thereby completed.

The withstand voltage of the trench capacitor thus completed and that of the conventional trench capacitor were evaluated by means of J–V measurement. The conventional trench capacitor is the one which is not subjected to thermal treatment for deforming the shape of the trench.

As samples, the ones including $10^6$ trench capacitors in 1 $mm^2$ which are connected in parallel were used.

Figure 18:
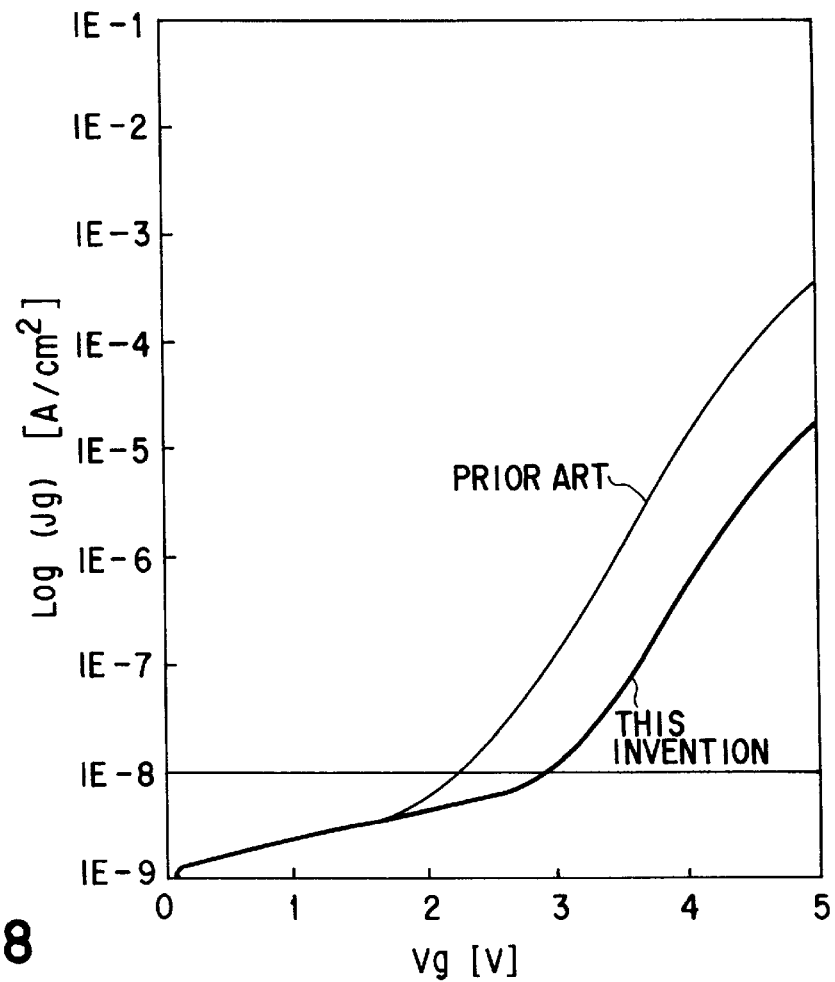
FIG. 18 are graphs showing J–V characteristics of a sample of the trench capacitor shown in FIG. 1 and that of a sample of the conventional trench capacitor.

FIG. 18 shows the result of the J–V characteristics of the samples. As can be seen from FIG. 18, if comparing prior art and the present invention in voltage Vg at which leak current log (Jg) is $1\times10^{-8}$ $A/cm^2$, the sample of the prior art capacitors is 2.25V whereas that of capacitors of the present invention is 3V. This means that the trench capacitor of the present invention is higher in withstand voltage than the conventional trench capacitor.

It is considered that the reason the withstand voltage of the present invention is improved is that the (rectangular) shape of the trench 15 at the time of formation is deformed into a (circular) shape which provides a larger minimum radius of curvature by thermal treatment and that electric field concentration is lessened due to the elimination of the uneven portions, which are derived from the RIE, on the inner surface of the trench 15.

Furthermore, the embedding shapes of the storage nodes of samples of the prior art and this embodiment according to the present invention were examined, respectively. While voids were present in the central portion of the trench of the prior art sample, no void was present in the sample of this embodiment.

In case of the trench capacitor where no voids were seen in this embodiment, the problem that thermal oxidation to be conducted for the formation of STI in later steps, causes defects, does not at all occur.

It is considered that no voids occurred because the shape of the trench was deformed such that the section area at a position near the bottom of the trench is larger than that at a position distant from the bottom thereof to thereby facilitate embedding the trench with the arsenic doped amorphous silicon film 19 which serves as a storage node.

In this embodiment, a hydrogen fluoride aqueous solution is employed for pretreatment (for removing the native oxide film). However, instead of using the hydrogen fluoride aqueous solution, liquid mixture of a hydrochloric acid aqueous solution and an ozone aqueous solution can be used to form a thin oxide film of about 1.5 nm in thickness. If thermal treatment is conducted within the chamber thereafter, the thin oxide film can be removed together with the native oxide film. Such a method can therefore provide the same advantage as that obtained in this embodiment.

In this embodiment, $PH_3$ gas is employed as an n-type impurity source when thermal treatment is conducted under the atmosphere of gas containing n-type impurities to form the n-type impurity diffused layer 17. $AsH_3$ (arsine) gas may be used. It is also possible to use He gas or the like as $PH_3$ dilution gas instead of hydrogen gas which acts to prevent $PH_3$ from dissolving.

In this embodiment, when thermal treatment is conducted to deform the shape of the trench, the chamber was set under 80 Torr at 1000° C. However, as long as if the chamber is set under reduced pressure at 850° C. or higher, the surface migration of silicon occurs and the shape of the trench can be deformed as in the case of this embodiment.

Figure 19:
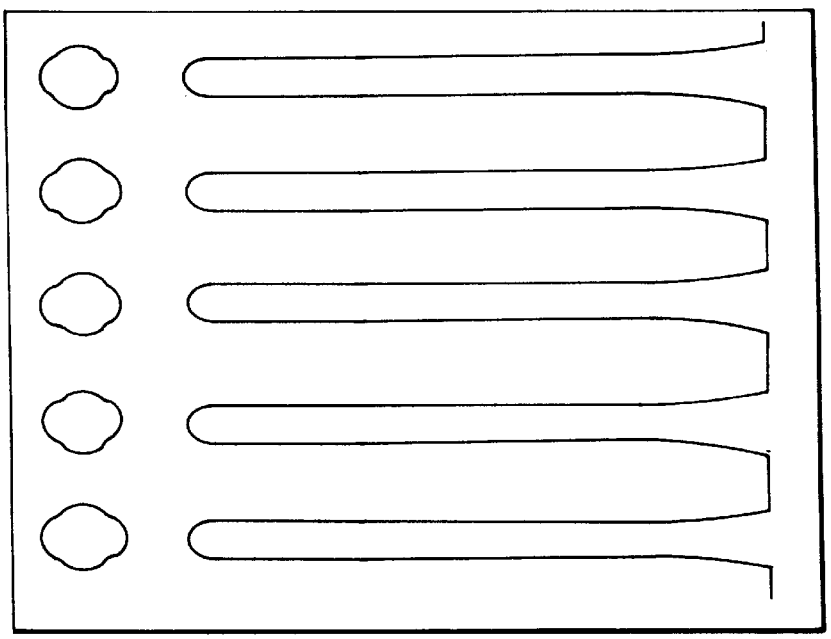
FIG. 19 is a view drawn based on the microphotograph of the sectional view of the trench in case the thermal treatment temperature is higher than 1200° C.
Figure 20:
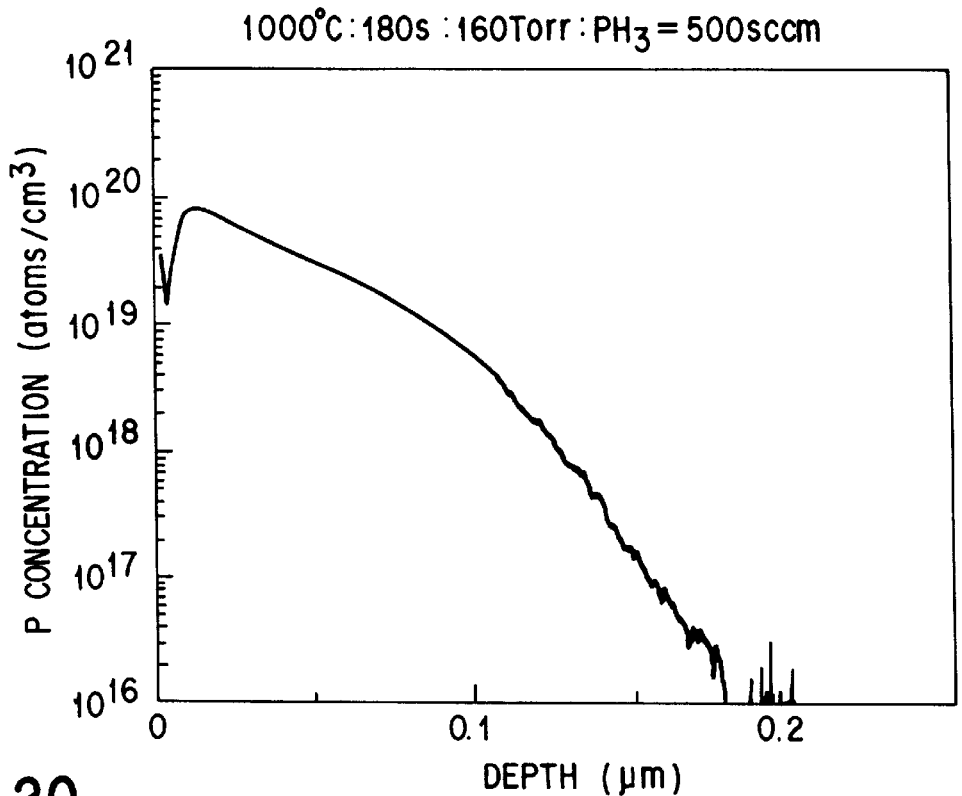
FIG. 20 shows the depth profile of P concentration of the n-type impurity diffused layer (or plate electrode) of the trench capacitor shown in FIG. 1.

As the pressure is lower and the temperature is higher, the surface migration of silicon becomes more obvious and a greater change in the trench shape arises. If the temperature is higher than 1200° C., or 1100° C. under some conditions, the phenomenon that the bottom of the trench is split occurs as shown in FIG. 19. FIG. 19 is a view drawn based on the section SEM photograph of the trench.

Considering this, it is necessary to set the temperature for thermal treatment for causing the surface migration of silicon at 1200° C., preferably 1100° C., or lower.

It is, meanwhile, discovered that the surface migration of silicon is suppressed in the thermal treatment under the atmosphere where PH$_3$ gas is introduced. Thus, if only hydrogen gas is introduced first and only PH$_3$ gas is then introduced, the shape of the trench does not change during P-doping and the shape obtained at the time only the hydrogen gas has been introduced is maintained even after P-doping.

In this embodiment, the description has been given to a case where hydrogen gas is introduced so as to cause the surface migration of silicon. It is, however, not always necessary to introduce hydrogen gas. As long as the chamber is set under reduced pressure, migration phenomenon does occur.

It is now noted, the surface of the silicon substrate is preferably oxidized and thermal treatment is conducted under the atmosphere of the low partial pressure of oxygen gas and steam which act to suppress the surface migration of silicon.

As in the case of this embodiment, however, if hydrogen gas is introduced, the reaction of generating SiO$_2$ is suppressed by the hydrogen deoxidization reaction, thereby facilitating silicon migration.

In other words, even under the environment where the partial pressure of oxygen gas and water vapor is not low, if reduction reaction is stronger in the oxidation-reduction reaction between silicon and SiO$_2$, the surface migration of silicon occurs.

Figure 21:
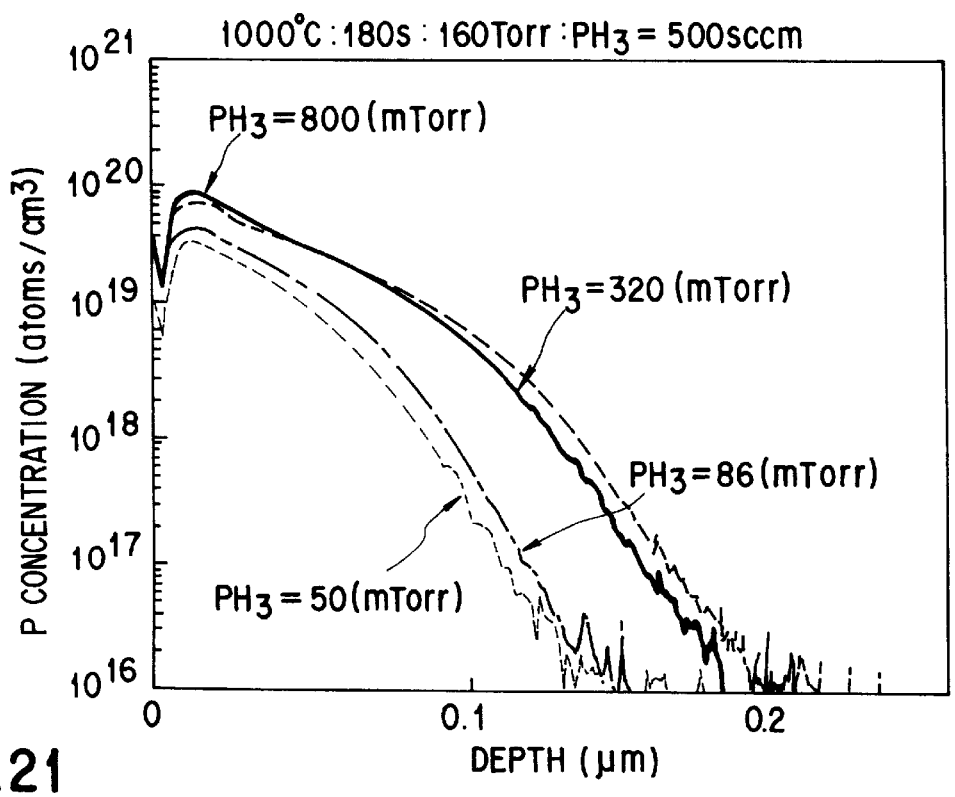
FIG. 21 shows the dependency of the depth profile of P concentration of the n-type impurity diffused layer (or plate electrode) on $PH_3$ gas partial pressure.

In the thermal treatment (vapor phase diffusion of PH$_3$) in this embodiment, if the temperature is 1000° C. or higher, the n-type impurity diffused layer (or plate electrode) 17 having a surface P concentration of $1 \times 10^{20}$ cm$^{-3}$ is obtained. It has been discovered that in case of the vapor phase diffusion of PH$_3$, the surface P concentration depends on the partial pressure of PH$_3$ gas as shown FIG. 21.

The n-type impurity diffused layer (or plate electrode 17) can be formed by the solid phase diffusion of the AsSG (arsenicsilicate glass) film as in the conventional case. If the diameter of the trench is smaller, the supply of diffusion source (As) is limited by the thickness of the AsSG film according to that method.

According to the vapor phase diffusion method in this embodiment, by contrast, even if the diameter of the trench is smaller (i.e., the aspect ratio is higher), it is possible to supply the diffusion source (P) to the surface of the trench from the vapor phase. In this embodiment, therefore, even with the smaller diameter of the trench, it is possible to easily form an n-type impurity diffused layer (or plate electrode) 17 including necessary amounts of impurities.

Moreover, the effect of the oxide film which is formed on the surface of the trench, on the vapor phase diffusion was examined. As a result, it was discovered that if the oxide film exists, diffusion is suppressed. To adopt vapor phase diffusion, therefore, it is preferable that the native oxide film is removed. High temperature thermal treatment under the hydrogen atmosphere for deforming the shape of the trench enables the removal of the native oxide film.

As can be seen in this embodiment, it is possible to not only improve, for example, withstand voltage but also decrease the number of manufacturing steps by conducting the thermal treatment for deforming the shape of the trench and the thermal treatment for forming the n-type impurity diffused layer (or plate electrode) 17 continuously in the chamber.

[Second Embodiment]

Figure 22:
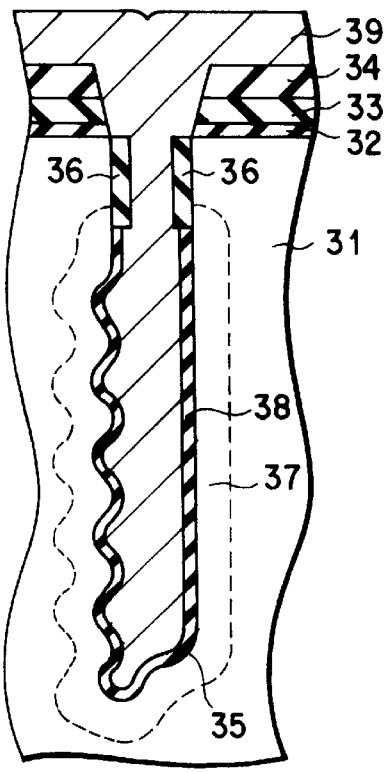
FIG. 22 is a longitudinal sectional view of a trench capacitor in the second embodiment according to the present invention.

FIG. 22 is a sectional view showing the trench capacitor in the second embodiment according to the present invention.

In FIG. 22, reference numeral 31 denotes a silicon substrate. On the silicon substrate 31, an insulation mask consisting of a silicon nitride film 33 and that consisting of an SiO$_2$ film 34 are formed via a thin SiO$_2$ film 32.

A trench 34 characteristic of the present invention is formed on the surface of the silicon substrate 31. Unlike the conventional trench, the trench 35 has a sectional shape of vertically asymmetric about the center of the trench diameter when cut in the direction of the trench depth through the center thereof. The insulation masks 33 and 34 are used as etching masks when the trench 35 is formed by the RIE.

A collar oxide film 36 is formed on the upper side wall of the trench 35. An n-type impurity diffused layer 37 of high impurity concentration which serves as a capacitor electrode (or plate electrode) is formed on the surface of the trench 35 by diffusing impurities from the vapor phase. An arsenic doped amorphous silicon film 39 (embedding member) serving as a storage node is embedded into the trench 35 via a capacitor insulating film 38 (embedding member).

With the trench capacitor having such a structure, the trench 35 has an asymmetric sectional shape. Due to this, even with the same depth, the surface area of the trench 35 is larger than that having a symmetric sectional shape (conventional case).

Even with the same depth, a higher capacity is obtained than in the conventional case. If the diameter of the trench is smaller, therefore, it is possible to ensure necessary capacity. This, in turn, makes it possible to realize far higher integration of, for example, DRAM cells.

The method of forming a trench capacitor in this embodiment will next be described. FIGS. 23A through 23H are sectional views showing the formation method by stages.

Figure 23A:
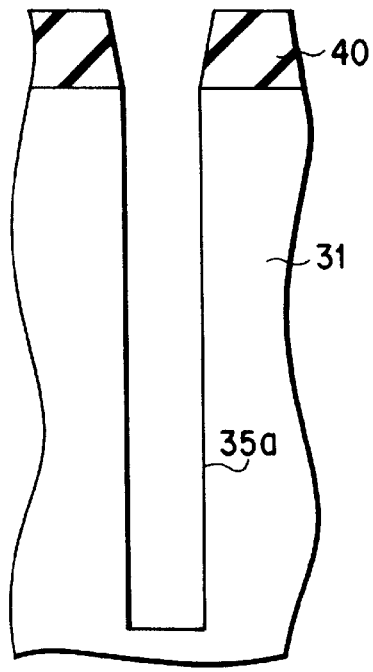
FIGS. 23A through 23H are longitudinal sectional views of the trench capacitor for showing a trench capacitor formation method by stages.

As shown in FIG. 23A, after an insulation mask 40 is formed on the silicon substrate 31, the silicon substrate 31 is patterned by the RIE method using the insulation mask 40 as an etching mask. As a result, a trench 35a of about 7 $\mu$m in depth is formed.

The dimensions of this trench 35a are, for example, 0.3 $\mu$m×0.6 $\mu$m. The insulation mask 40 is then removed.

Next, first thermal treatment is conducted under the reduced pressure and hydrogen atmosphere. The conditions of the thermal treatment at this time are 1100° C., 10 Torr, 10 min., 10 slm hydrogen flow rate.

Figures 23B, 23C, 23D:
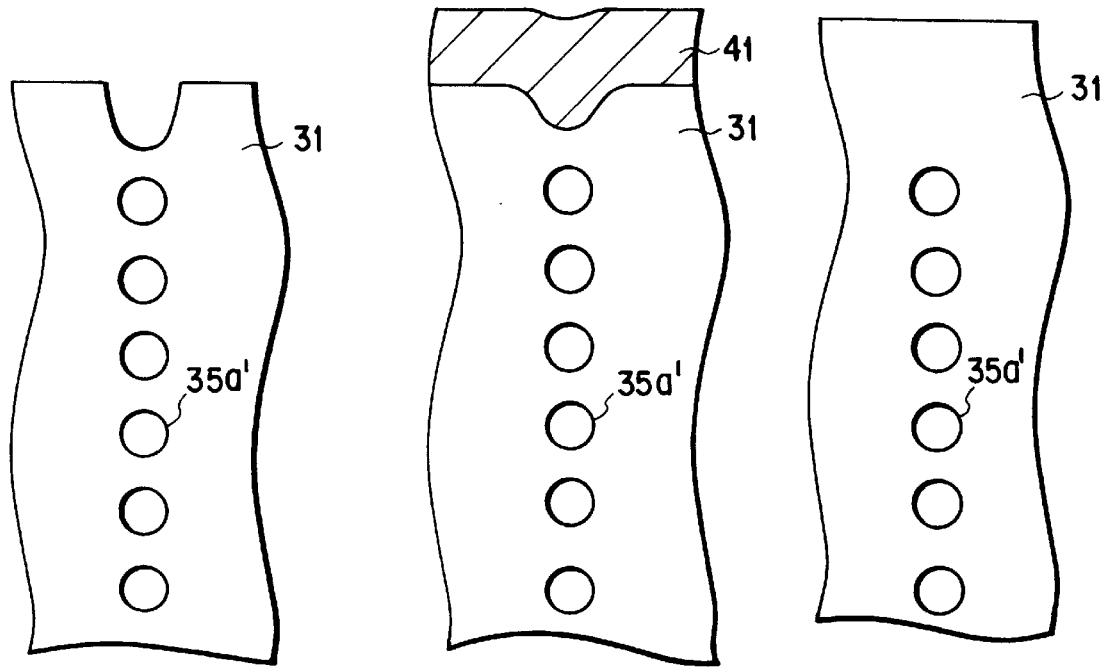

If thermal treatment of this type is conducted, the native oxide film on the surface of the trench 35a is removed and the surface migration of silicon occurs, with the result that the shape of the trench 35a is deformed to provide a minimum surface area. Consequently, as shown in FIG. 23B, starting with the bottom, the trench 35a is separated into a plurality of cells 35a' one after another in a generally spherical shape. Namely, the trench 35a is locally filled with silicon and is separated into a plurality of vacant regions (cells).

FIGS. 24A and 24B are views drawn based on the section SEM photographs of the trench 35a prior to and after the first thermal treatment, respectively. FIG. 24A is a view prior to thermal treatment and FIG. 24B is a view after thermal treatment. As is obvious from FIGS. 24A and 24B, the trench 35a can be separated into a plurality of cells 35a' by the high temperature thermal treatment.

Figure 27:
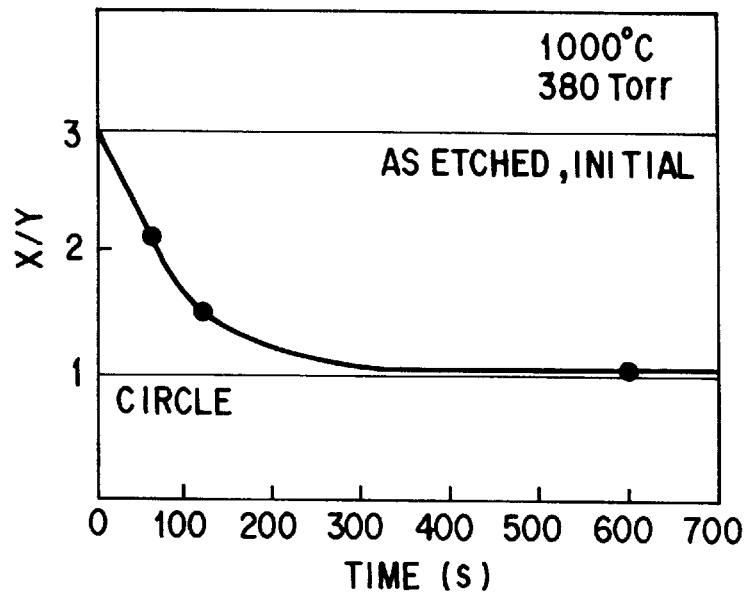
FIG. 27 shows the dependency of the sectional shape of the trench (X/Y) on time with regard to the thermal treatment.
Figure 28:
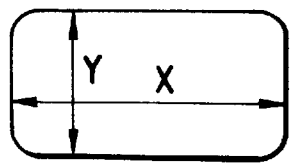
FIG. 28 is a view for defining X and Y of the sectional shape of the trench.

FIGS. 25 through 27 show the results of the first thermal treatment under various conditions with respect to the trench of a depth of 7 $\mu$m. FIGS. 25 through 27 indicate X/Y temperature dependency, X/Y pressure dependency and X/Y time dependency, respectively where a minor diameter is Y and a major diameter is X in the trench section (which is a section obtained when the trench 35a is cut at a plane parallel to the surface of the substrate) as shown in FIG. 28.

It should be noted that these results are obtained from the sectional shape of the trench 35a of a depth of 6 $\mu$m. It should be also added that X/Y right after the trench is formed is 3 and that FIGS. 25 through 27 indicate temperature, pressure and time of obtaining the circular section, i.e., X/Y (=1), respectively.

As can be seen from FIGS. 25 through 27, as the temperature is higher, the pressure is lower and longer time is spent, the shape of the trench is changed in a greater degree. Finally, the sectional shape becomes a circle. If, however, thermal treatment is further continued, the trench begins to be separated starting with its lower part and a plurality of cells 35a' are formed.

The change in the shape of the trench in the first thermal treatment is not seen when the surface of the substrate is covered with, for example, an oxide film and a nitride film. To change the shape of the trench, it is required to remove the oxide film and nitride film and then to remove the native oxide film on the surface of the substrate within the equipment.

To remove the native oxide film, the partial pressure of water vapor within the equipment needs to be reduced in a sufficient manner. The introduction of hydrogen is effective for reducing the partial pressure of water vapor. The experiments (FIGS. 25 through 27) in this embodiment were conducted in the hydrogen atmosphere.

As stated above, under the hydrogen atmosphere (i.e., reduction atmosphere), the native oxide film on the surface can be removed and the shape of the trench can be deformed. Under the 100% hydrogen atmosphere, there is a problem from the safety viewpoint such as the danger of explosion. It is preferable therefore that gas mixture with inert gas is used to such an extent that the reduction atmosphere can be maintained.

Back to the description of the formation method, as shown in FIG. 23C, the surface of the silicon substrate 31 is smoothed by the second thermal treatment under reduced pressure and hydrogen atmosphere. The temperature is then reduced to 600° C. and a non-doped amorphous silicon film 41 of about 1 μm in thickness is continuously deposited on the entire surface within the same chamber as in the second thermal treatment.

Next, while the temperature of the chamber is increased to 1100° C., the third thermal temperature is continuously conducted within the same chamber under the reduced pressure and hydrogen atmosphere. As a result, as shown in FIG. 23D, the surface of the substrate is flattened.

Through the third thermal treatment, the amorphous silicon film 41 is grown by solid phase epitaxial growth from the substrate, and formed into a monocrystalline silicon film and integrated into the silicon substrate 31. Active silicon atoms on the surface of the substrate migrate so as to flatten the surface of the substrate.

Figure 23E:
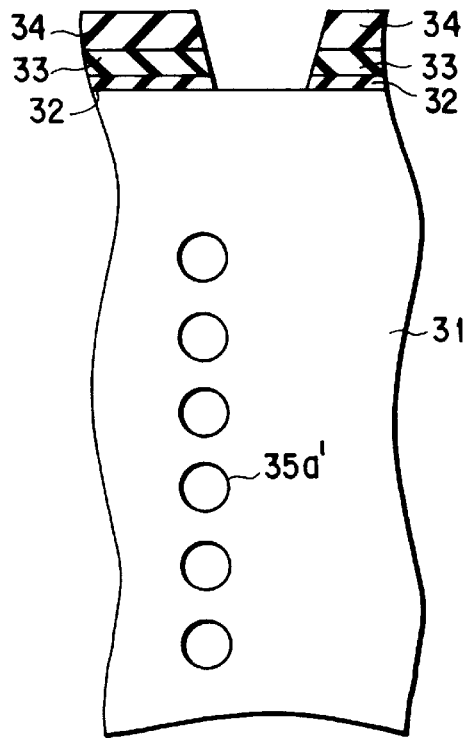

Now, as shown in FIG. 23E, an insulation mask consisting of a silicon nitride film 33 and that of an $SiO_2$ film 34 are formed through a thin $SiO_2$ film 32 on the silicon substrate 31.

Figure 23F:
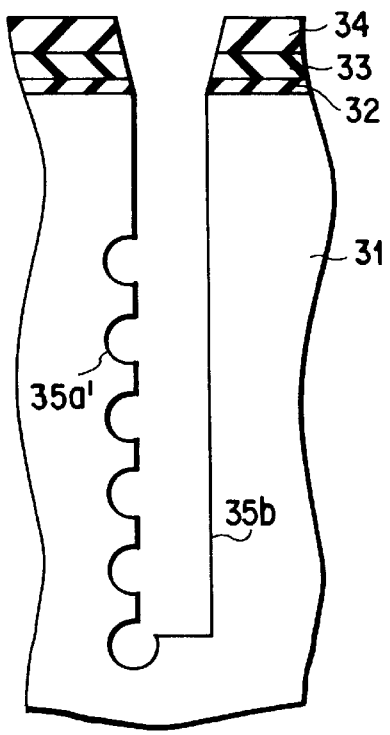

As shown in FIG. 23F, using the insulating masks 33 and 34 as masks, the silicon substrate 31 is patterned by the RIE to thereby form a trench 35b having a depth of about 7 μm. At this time, the trench 35b is formed to overlap the cells 35a'. Alignment between the cells 35a' and the trench 35b will be described later.

Figure 29:
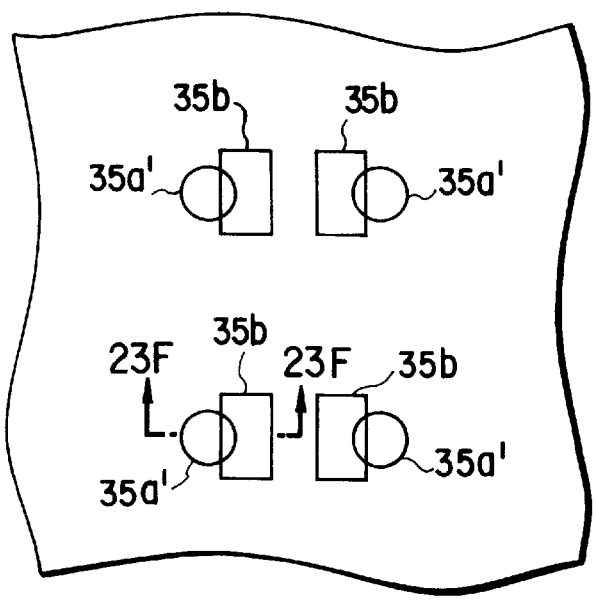
FIG. 29 is a typical plan view showing the layout of the trenches.

FIG. 29 illustrates a layout of the cells 35a' and the trench 35b at this stage. This is a view seen from the top of the substrate. FIG. 23F corresponds to the sectional view taken along line 23F—23F of FIG. 29.

As shown in FIGS. 30A and 30B, the trench 35b may be formed in a position slightly apart from the cells 35a'. If so, the cells 35a' and the trench 35b can be composed in the fourth thermal treatment in the later step, whereby the trench 35 shown in FIG. 30C can be obtained.

Figure 23G:
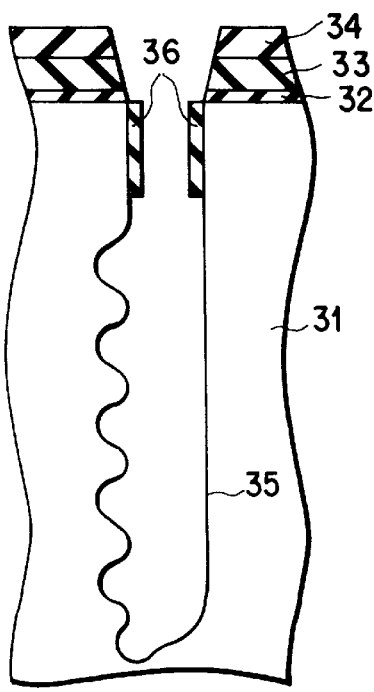

Next, as shown in FIG. 23G, after a collar oxide film 36 is formed on the upper side wall of the trench 35b, the fourth thermal treatment is conducted under the reduced pressure and the hydrogen atmosphere so as to remove the native oxide film on the surfaces of the trenches 35a and 35b.

Through the fourth thermal treatment, as shown in FIG. 23G, the unevenness on the surface of the trench 35b is lessened to thereby get rid of portions having a small radius of curvature. By so doing, it is possible to relieve the concentration of the electric field at the capacitor and to complete the trench 35 of a shape which can improve withstand voltage.

Even if the cells 35a' and the trench 30b are formed as in the layout shown in FIG. 30A, the surface of the trench is deformed to a smooth shape through the shapes shown in FIGS. 30B and 30C. Thus, the same advantage can be expected, as well.

The trench 35 thug formed has a larger surface area than that of the conventional trench which side wall is formed vertically by the RIE. Due to this, it is possible to increase the area of the capacitor, which results in an increase in the capacity of the capacitor.

Figure 23H:
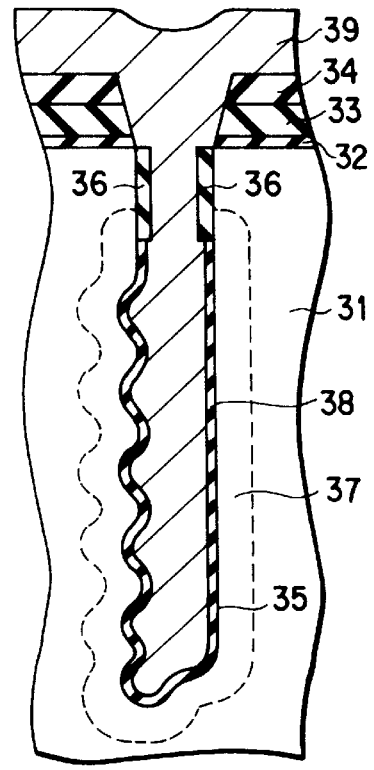

Next, as shown in FIG. 23H, without exposing a wafer to the atmospheric air, a high impurity concentration n-type impurity diffused layer 37 which serves as a capacitor electrode (or plate electrode) is continuously formed on the surface of the trench within the same chamber by impurity diffusion from vapor phase under the atmosphere of gas containing n-type impurities such as $PH_3$ and $AsH_3$.

Finally, as shown in FIG. 23H, a capacitor insulating film 38 consisting of, for example, $SiO_2$ is formed on the n-type impurity diffused layer 37. Thereafter, an arsenic doped amorphous silicon film 39 serving as a storage node is embedded into the trench 36 and a trench capacitor is thus completed.

Description will now be shifted to the method of aligning the cells 35a' and the trench 35b.

As shown in FIG. 31A, for example, when the trench 35a is formed, a shallow trench 35' having a larger diameter than that of the trench 35a is also formed in a region other than the trench capacitor formation region. As shown in FIG. 31B, the trench 35a is converted into a plurality of cells 35a' and the surface of the substrate is flattened. During the steps, the surface of the region where the trench 35' is formed is not flattened and the trench 35' remains as a recessed portion. A trench 35b overlapping the cells 35a' can be formed by using the recessed trench 35' as a mark.

FIGS. 32A through 32D are views showing steps for another method of aligning the cells 35a' and the trench 35b.

Figure 32A:
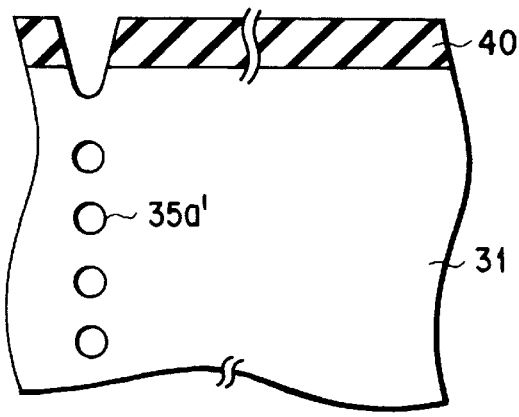
FIGS. 32A through 32D are longitudinal sectional views showing another trench alignment method by stages.
Figure 32B:
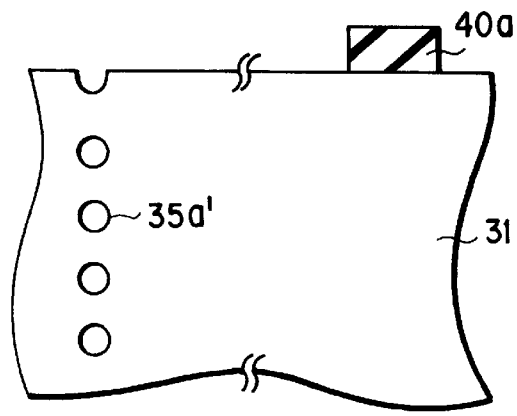

In the case shown therein, after the first thermal treatment (FIG. 32A), an insulation mask 40 is patterned on the silicon substrate 31 and a mark 40a of insulating material is formed in a region other than the trench capacitor formation region as shown in FIG. 32B.

Figure 32C:
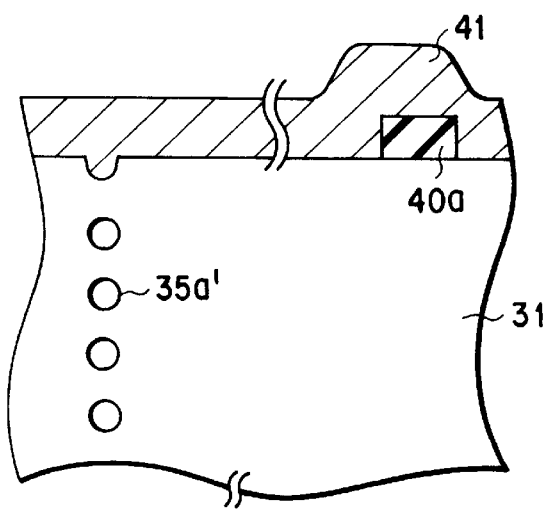
Figure 32D:
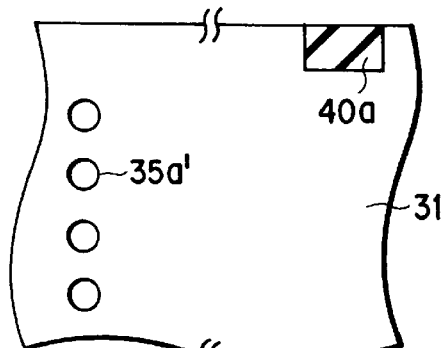

Next, as shown in FIG. 32C, an amorphous silicon film 41 is deposited on the entire surface.

As in the case of the step of FIG. 23D, the amorphous silicon film 41 is mono-crystallized and the surface is flattened by thermal treatment. Thereafter, the surface is backed by, for example, etchback or CMP, to thereby expose the surface of the mark 40a. Here, the mark 40a is used as a stopper for the etchback or CMP. Since the exposed surface of the mark 40a is insulating material which differ in optical property from silicon, the mark 40a can be used as an alignment mark for forming the trench 35b.

In this embodiment, the non-doped amorphous silicon film 41 is deposited in the step of FIG. 23C. Instead of this, an amorphous silicon film containing n-type or p-type impurities may be deposited.

If the trench capacitor formed by depositing the impurity containing amorphous silicon film is used for, for example, a DRAM capacitor, it is possible to control the carrier concentration in the channel region of the MOS transistor.

Additionally, the surface migration of silicon by the thermal treatment under reduced pressure in the present invention normally occurs if the temperature is 850° C. or higher. If the thermal treatment temperature is higher than 1200° C., or 1100° C. in some cases, the bottom portion of the trench is separated as shown in FIGS. 24A and 24B. For that reason, the first thermal treatment for forming cells from the trench needs to be conducted at 1200° C. or higher and the second through fourth thermal treatment for lessening unevenness on the inner surface of the trench needs to be conducted at not lower than 850° C. and not higher than 1200° C., preferably 1100° C.

It is noted that the surface migration by the thermal treatment is suppressed under the atmosphere where $PH_3$ or $AsH_3$ is introduced to form the n-type impurity diffused layer (or plate electrode) 37.

Owing to this, while $PH_3$ or $AsH_3$ is introduced and P-doping or As-doping is conducted, the shape of the trench 35 does not change and the shape obtained at the time only hydrogen is introduced is maintained even after the n-type impurity diffused layer (or plate electrode) 37 is doped.

In this embodiment, hydrogen is introduced to cause the surface migration of silicon. However, it is not necessarily done so. As long as the pressure is reduced and the atmosphere of low partial pressure of the oxygen gas or oxidizing gas, such as steam, which acts to oxidize the surface of the silicon and to suppress the silicon surface migration is maintained, migration phenomenon does occur.

However, if the hydrogen which causes reducing reaction is introduced, the reaction of oxidizing Si to generate $SiO_2$ tends to be inhibited. Due to this, even if the partial pressure of oxygen and steam is low, it is possible to easily migrate Si. As a result, if the reducing reaction is stronger in the oxidation-reduction reaction between Si and $SiO_2$, Si migration is possible.

The present invention should not be limited to the above-stated embodiment. The above embodiment, for example, illustrates a case of the trench of the trench capacitor. The present invention is also applicable to the element isolation groove by, for example, STI. In such a case, the following advantages can be obtained.

According to the present invention, the angular portions at the bottom of the trench are rounded in particular. The angular portions at the upper part of the trench are also rounded. Due to this, even if the element isolation groove is insufficiently embedded, the upper side wall of the element isolation groove is exposed and a gate electrode is provided therein, then it is possible to lessen the concentration of the electric field by gate voltage.

The lessening of the field concentration can also improve gate withstand voltage and solve the problem that the transistor having insufficient embedding is turned on earlier than the rest. Besides, by rounding the angular portions of the trench, embedding the element separation insulating film is facilitated.

As stated above, according to the present invention, the surface migration of silicon occurs due to the thermal treatment under reduced pressure and thereby the surface of the silicon can be smoothed. There are cases where the above-stated planarization phenomenon is locally required. An embodiment which makes such processing possible will next be described.

[Third Embodiment]

FIGS. 35A through 35H are sectional views showing a semiconductor device manufacturing method in the third embodiment according to the present invention. In this embodiment, description will be given to the method of manufacturing a MOS transistor which elements are isolated by the STI.

As shown in FIG. 35A, a thermal oxide film 52 which becomes a gate oxide film, a polycrystalline silicon film 53 which becomes a polycrystalline silicon gate electrode, a silicon nitride film 54 and a silicon oxide film 55 are sequentially formed on a monocrystal silicon substrate 51.

A photoresist pattern 56 is formed on the silicon oxide film 55. Thereafter, using the photoresist pattern 56 as a mask, the silicon oxide film 55, the silicon nitride film 43, the polycrystalline silicon film 53, the thermal oxide film 52 and the silicon substrate 51 are sequentially etched by the RIE method. As a result, a shallow trench 57 having a depth of 0.4 μm serving as an element isolation groove is formed as well as a polycrystalline silicon gate electrode 53 and a gate oxide film 52 (FIG. 35B).

Next, after the photoresist pattern 56 is carbonized and peeled off, a thin silicon oxide film 58 is formed on the surface of the trench 57 and that of the polycrystalline silicon gate electrode 53 using an aqueous solution mixed of hydrochloric acid and ozone (FIG. 35C).

A positive-type photoresist 59 is embedded into the trench 7. To be specific, a positive-type photoresist 59 thick enough to embed the trench 57 therewith is coated on the entire surface, for example. Thereafter, the portion of the photoresist 59 located above the trench 57 is exposed and then development is conducted to thereby dissolve the photoresist 59 (FIG. 35D).

Figure 35E:
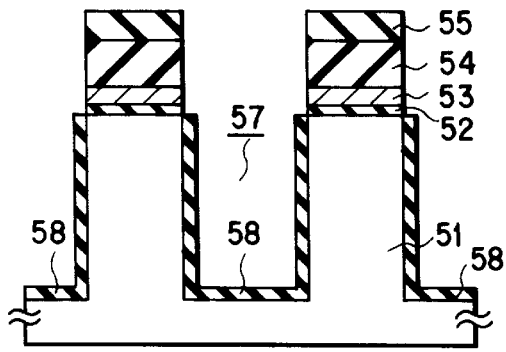

Using the photoresist 59 as a mask, the silicon oxide film 58 formed on the surface of the polycrystalline silicon gate electrode 58 is removed by a hydrogen fluoride aqueous solution. After that, the photoresist 59 is carbonized and peeled off (FIG. 35E).

Figure 35F:
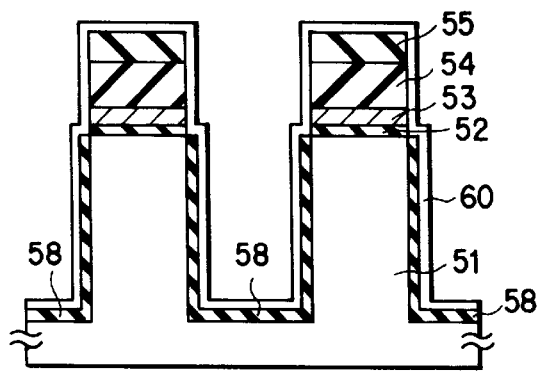

Next, the substrate is exposed to the carbon-containing atmosphere and a carbon film 60 is formed on the entire surface of the substrate (FIG. 35F).

Figure 35G:
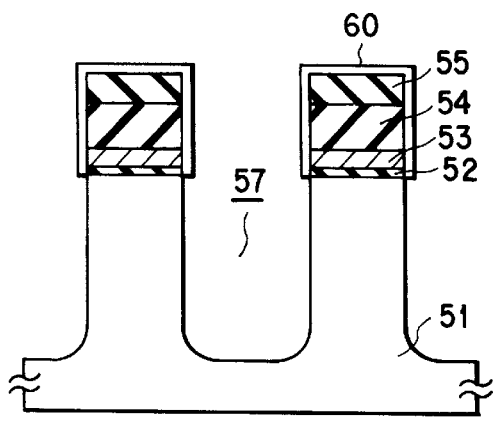

Thermal treatment is conducted under hydrogen atmosphere at 950° C., under 10 Torr for one minute.. As a result, not only the silicon oxide film 58 formed on the surface of the trench 57 but also the carbon film 60 formed thereon are removed. At the same time, the surface of the trench is smoothed and the angular portions at the bottom of the trench 57 are rounded (FIG. 35G).

The reason the thin silicon oxide film 58 is removed is, it is considered, that $SiO_2$ of the silicon oxide film 58 is chemically changed to SiO after Si is supplied from the silicon substrate under the above-stated thermal treatment and the resultant SiO is diffused outside through the carbon film 60. Following this, the carbon film 60 is also removed since its lower film is not present.

If thermal treatment under reduced pressure, high temperature hydrogen gas atmosphere is selected, it is possible to simultaneously realize the removal of the thin silicon oxide film 58 and the improvement of the shape of the trench 57 and to thereby decrease the number of steps.

In addition, since the hydrogen gas atmosphere is the reducing gas atmosphere, it is possible to prevent the re-oxidation of the surface of the trench 57. This can, in turn, prevent the surface migration of silicon which provides a smooth surface of the trench 57 from being suppressed.

FIGS. 36A and 36B are views drawn based on the microphotographs of the sectional views of the trench at stages shown in FIGS. 35F and 35G. As can be seen from FIGS. 36A and 36B, the angular portions of the bottom of the trench 57 can be rounded by the thermal treatment under the hydrogen atmosphere.

At this time, the carbon film 60 formed on the surface of the polycrystalline silicon gate electrode 53 is not removed and the surface of the polycrystalline silicon gate electrode 53 is protected by the carbon film 60. The shape of the polycrystalline silicon gate electrode 53 remains as the initial shape.

Figure 35H:
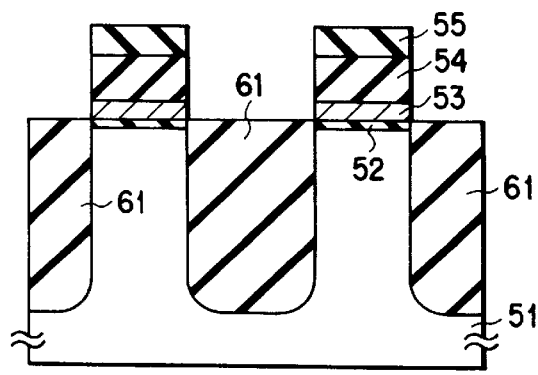

Next, as shown in FIG. 35H, after the remaining carbon film 60 is removed by, for example, liquid mixture of sulfuric acid and hydrogen peroxide, the element isolation insulating film 11 is embedded into the trench 7.

At this time, the surface of the trench 57 is smoothed and the angular portions at the bottom of the trench 57 are rounded, with the result that the trench 57 can be embedded with favorable shaped element isolation insulating film 61.

As a result, it is possible to prevent deterioration in the MOS transistor characteristics including, for example, the phenomenon that part of the channel of the MOS transistor is turned on earlier than the rest from occurring. It is also possible to prevent the lowering of reliability caused by defective element isolation.

Finally, according to the well-known method, a source diffused layer and a drain diffused layer (both not shown) are formed, thereby completing a MOS transistor which elements have been isolated by the STI.

The inventors of the present invention examined the migration phenomenon of a polycrystalline silicon film with/without a carbon film by using two samples, i.e., a polycrystalline silicon film having a surface which is covered with a carbon film and that having a surface which is not covered with a carbon film.

Specifically, a polycrystalline silicon film of 20 nm in thickness was formed on a silicon oxide film of 50 nm in thickness, and a sample with a carbon film and a sample without a carbon film were prepared. They were annealed under the hydrogen atmosphere. The inventors examined how the surface roughness of the polycrystalline silicon film changed according to a change in annealing temperature. The surface roughness was measured by the Atomic Force Microscope (to be referred to as AFM hereinafter).

FIG. 37 shows the examination result, that is, the relationship between the annealing temperature and the surface roughness (Ra) of the polycrystalline silicon film. As can be seen from FIG. 37, if the surface is not covered with the carbon film, the surface roughness of the polycrystalline silicon film increased as the annealing temperature increased. It is considered that this is because surface migration and then agglomeration tend to occur more frequently if the annealing temperature increases.

Meanwhile, if the surface was covered with the carbon film, the surface roughness hardly changes even with a change in the annealing temperature. This indicates that the carbon film functions to suppress the surface migration of the polycrystalline silicon film.

In this case, Ra indicates mean roughness expressed as the average absolute value of deflection.

The present invention should not be limited to the above-stated embodiment. In this embodiment, the substrate is exposed to the carbon containing gas atmosphere and the carbon is attached to the surface of the polycrystalline silicon film to thereby form a carbon film. It is however possible to form a carbon containing film (organic film) by dipping the substrate into a carbon containing solution, for example, a glycerin solution.

Furthermore, the above-stated embodiment illustrates a case of the surface of the polycrystalline silicon gate electrode (polycrystalline silicon region) and the surface of the element isolation trench (monocrystalline silicon region) as a combination of silicon regions having different crystalline structures. However, the present invention is also applicable to a combination of the surface of the polycrystalline silicon gate electrode of the trench-type memory cell (polycrystalline silicon region) and the surface of the trench of the capacitor (monocrystalline silicon region).

In the latter case, the angular portions of the trench, in particular, those at the bottom of the trench are rounded by the thermal treatment under the reduced pressure. During the step, it is possible to prevent the shape of the polycrystalline silicon gate electrode from changing. In other words, it is possible to improve the withstand voltage of the capacitor insulating film without causing deterioration in the shape of the polycrystalline silicon gate electrode.

Moreover, the above-stated embodiment illustrates a case where carbon is attached to the surface of the polycrystalline silicon (gate electrode) and to that of the monocrystalline silicon (substrate) to thereby form a carbon film. It is also possible to form a carbon film by attaching carbon to the surface of the amorphous silicon.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising the steps of:

forming a trench on a surface of a semiconductor substrate;

deforming said trench by a thermal treatment under reduced pressure such that, while a section of said trench when cut by a first plane perpendicular to a direction of a depth of the trench is defined as a first section and a section of said trench when cut by a second plane perpendicular to the direction of the depth of the trench and closer to a bottom of said trench than said first plane is defined as a second section, an area of said first section is smaller than an area of said second section and that a minimum radius of curvature of said first section is smaller than a minimum radius of curvature of said second section; and embedding an interior of said trench with an embedding member.

2. A semiconductor device manufacturing method according to claim 1, wherein the step of embedding the interior of said trench with the embedding member includes:

a step of forming an impurity diffused layer, serving as a first capacitor electrode, on an inner surface of said trench by diffusing impurities into the inner surface of said trench; and a step of embedding the interior of said trench with a second capacitor electrode through a capacitor insulating film.

3. A semiconductor device manufacturing method according to claim 2, wherein the step of forming said impurity diffused layer includes a step of diffusing said impurities into the inner surface of said trench by a thermal treatment under an atmosphere of gas containing said impurities.

4. A semiconductor device manufacturing method according to claim 2, wherein the step of deforming said trench and the step of diffusing said impurities are continuously conducted within a same vacuum chamber by said thermal treatment under reduced pressure.

5. A semiconductor device manufacturing method according to claim 3, wherein the step of deforming said trench includes a step of reducing a surface of said semiconductor substrate under a reducing gas atmosphere by said thermal treatment under reduced pressure.

6. A semiconductor device manufacturing method comprising the steps of:

forming a trench on a surface of a semiconductor substrate;

deforming said trench by a thermal treatment under reduced pressure such that, while a section of said trench when cut by a first plane perpendicular to a direction of a depth of said trench at a position away from a bottom of said trench by a distance corresponding to $\frac{4}{5}$ of the depth of said trench in a direction of said surface is defined as a first section and a section of said trench when cut by a second plane perpendicular to a direction of the depth of said trench at a position away from the bottom of said trench by a distance corresponding to $\frac{1}{5}$ of the depth of the trench in the direction of said surface is defined as a second section, a value obtained by diving a major diameter of said second section by a minor diameter of said second section is smaller than 1.1 times of a value obtained by dividing a major diameter of said first section by a minor diameter of said first section; and embedding an interior of said trench with an embedding member.

7. A semiconductor device manufacturing method according to claim 6, wherein the step of embedding the interior of said trench with the embedding member includes:

a step of forming an impurity defused layer, serving as a first capacitor electrode, on an inner surface of said trench by diffusing impurities into the inner surface of said trench; and a step of embedding the interior of said trench with a second capacitor electrode through a capacitor insulating film.

8. A semiconductor device manufacturing method according to claim 7, wherein the step of forming said impurity diffused layer includes a step of diffusing said impurities into the inner surface of said trench by thermal treatment under an atmosphere of gas containing said impurities.

9. A semiconductor device manufacturing method according to claim 7, wherein the step of deforming said trench and the step of diffusing said impurities are continuously conducted within a same vacuum chamber by the thermal treatment under reduced pressure.

10. A semiconductor device manufacturing method according to claim 6, wherein the step of deforming said trench includes a step of reducing the surface of said semiconductor substrate under a reducing gas atmosphere by the thermal treatment under reduced pressure.

* * * * *